(12) United States Patent
Ge et al.

(10) Patent No.: US 10,074,666 B2
(45) Date of Patent: Sep. 11, 2018

(54) THREE-DIMENSIONAL MEMORY DEVICE WITH ENHANCED MECHANICAL STABILITY SEMICONDUCTOR PEDESTAL AND METHOD OF MAKING THEREOF

(71) Applicant: SANDISK TECHNOLOGIES LLC, Plano, TX (US)

(72) Inventors: Chun Ge, Fremont, CA (US); Yanli Zhang, San Jose, CA (US); Johann Alsmeier, San Jose, CA (US); Fabo Yu, San Ramon, CA (US); Jixin Yu, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/401,426

(22) Filed: Jan. 9, 2017

(65) Prior Publication Data
US 2018/0197876 A1    Jul. 12, 2018

(51) Int. Cl.
| H01L 29/788 | (2006.01) |
| H01L 27/11582 | (2017.01) |
| H01L 27/1157 | (2017.01) |
| H01L 27/11573 | (2017.01) |
| H01L 27/11524 | (2017.01) |
| H01L 27/11556 | (2017.01) |

(Continued)

(52) U.S. Cl.
CPC .... *H01L 27/11582* (2013.01); *H01L 23/5226* (2013.01); *H01L 23/5283* (2013.01); *H01L 27/1157* (2013.01); *H01L 27/11524* (2013.01); *H01L 27/11529* (2013.01); *H01L 27/11556* (2013.01); *H01L 27/11573* (2013.01)

(58) Field of Classification Search
None
See application file for complete search history.

(56) References Cited

U.S. PATENT DOCUMENTS

| 5,915,167 A | 6/1999 | Leedy |
| 9,023,719 B2 | 5/2015 | Pachamuthu et al. |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Sitaramarao S Yechuri
(74) *Attorney, Agent, or Firm* — The Marbury Law Group PLLC

(57) ABSTRACT

After formation of an alternating stack of insulating layers and sacrificial material layers, a memory opening can be formed through the alternating stack, which is subsequently filled with a columnar semiconductor pedestal portion and a memory stack structure. Breakage of the columnar semiconductor pedestal portion under mechanical stress can be avoided by growing a laterally protruding semiconductor portion by selective deposition of a semiconductor material after removal of the sacrificial material layers to form backside recesses. At least an outer portion of the laterally protruding semiconductor portion can be oxidized to form a tubular semiconductor oxide spacer. Electrically conductive layers can be formed in the backside recesses to provide word lines for a three-dimensional memory device.

26 Claims, 23 Drawing Sheets

(51) Int. Cl.
*H01L 27/11529* (2017.01)
*H01L 23/522* (2006.01)
*H01L 23/528* (2006.01)

(56) References Cited

U.S. PATENT DOCUMENTS

| | | |
|---|---|---|
| 9,035,372 B2 | 5/2015 | Song |
| 9,230,973 B2 | 1/2016 | Pachamuthu et al. |
| 9,230,979 B1 | 1/2016 | Pachamuthu et al. |
| 9,230,980 B2 | 1/2016 | Rabkin et al. |
| 9,230,987 B2 | 1/2016 | Pachamuthu et al. |
| 9,245,962 B1 * | 1/2016 | Yang ............... H01L 29/42344 |
| 9,246,088 B2 | 1/2016 | Yamato et al. |
| 9,356,043 B1 | 5/2016 | Sakakibara et al. |
| 9,455,263 B2 | 9/2016 | Zhang et al. |
| 9,524,976 B2 | 12/2016 | Pachamuthu et al. |
| 2007/0252201 A1 | 11/2007 | Kito et al. |
| 2014/0054676 A1 | 2/2014 | Nam et al. |
| 2014/0198553 A1 | 7/2014 | Lung |
| 2014/0264548 A1 | 9/2014 | Lee et al. |
| 2014/0284691 A1 | 9/2014 | Takamura et al. |
| 2015/0076586 A1 * | 3/2015 | Rabkin ............... G11C 16/0483 257/324 |
| 2015/0104916 A1 | 4/2015 | Lee et al. |
| 2015/0115348 A1 | 4/2015 | Nam et al. |
| 2015/0179660 A1 | 6/2015 | Yada et al. |
| 2015/0236038 A1 * | 8/2015 | Pachamuthu ..... H01L 27/11582 257/326 |
| 2015/0294978 A1 | 10/2015 | Lu et al. |
| 2015/0348984 A1 | 12/2015 | Yada et al. |
| 2016/0056169 A1 | 2/2016 | Lee et al. |
| 2016/0079272 A1 | 3/2016 | Lee et al. |
| 2016/0099289 A1 | 4/2016 | Yamamoto et al. |
| 2016/0111432 A1 | 4/2016 | Rabkin et al. |
| 2016/0141294 A1 | 5/2016 | Peri et al. |
| 2016/0268209 A1 | 9/2016 | Pachamuthu et al. |
| 2016/0300848 A1 | 10/2016 | Pachamuthu et al. |
| 2016/0343730 A1 | 11/2016 | Son et al. |

OTHER PUBLICATIONS

Wong, M. et al., "Wafer Temperature Dependence of the Vapor-Phase HF Oxide Etch," J. Electrochem., Soc., vol. 140, No. 1, pp. 205-208, (1993).
Non-Final Office Action for U.S. Appl. No. 14/927,708, dated Nov. 25, 2016, 22 pages.
Office Communication for U.S. Appl. No. 14/927,990, dated Jun. 13, 2016, 8 pages.
U.S. Appl. No. 14/927,708, filed Oct. 30, 2015, Sandisk Corporation.
U.S. Appl. No. 14/927,990, filed Oct. 30, 2015, Sandisk Corporation.
U.S. Appl. No. 14/989,206, filed Jan. 6, 2016, Sandisk Corporation.
U.S. Appl. No. 15/226,132, filed Aug. 2, 2016, Sandisk Corporation.
Invitation to Pay Additional Fees and, Where Applicable, Protest Fee (PCT Article 17(13)(a) and Rule 40.1 and 40.2 (e)) and Communication Relating to the Results of the Partial International Search for International Application No. PCT/US2017/060999, dated Feb. 16, 2018, 14 pages.
International Search Report and Written Opinion of the International Searching Authority for International Patent Application No. PCT/US2017/060999, dated Apr. 10, 2018, 19 pages.

* cited by examiner

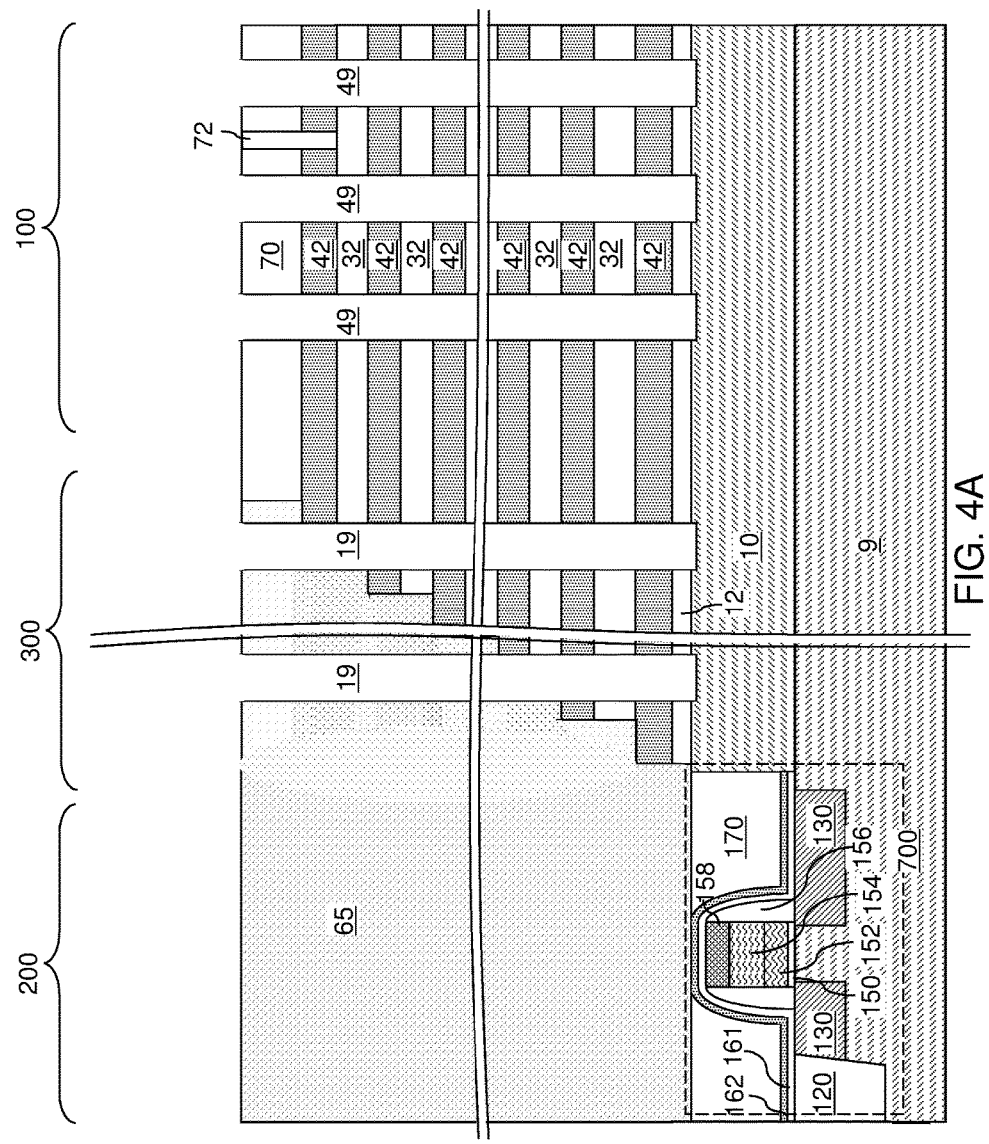

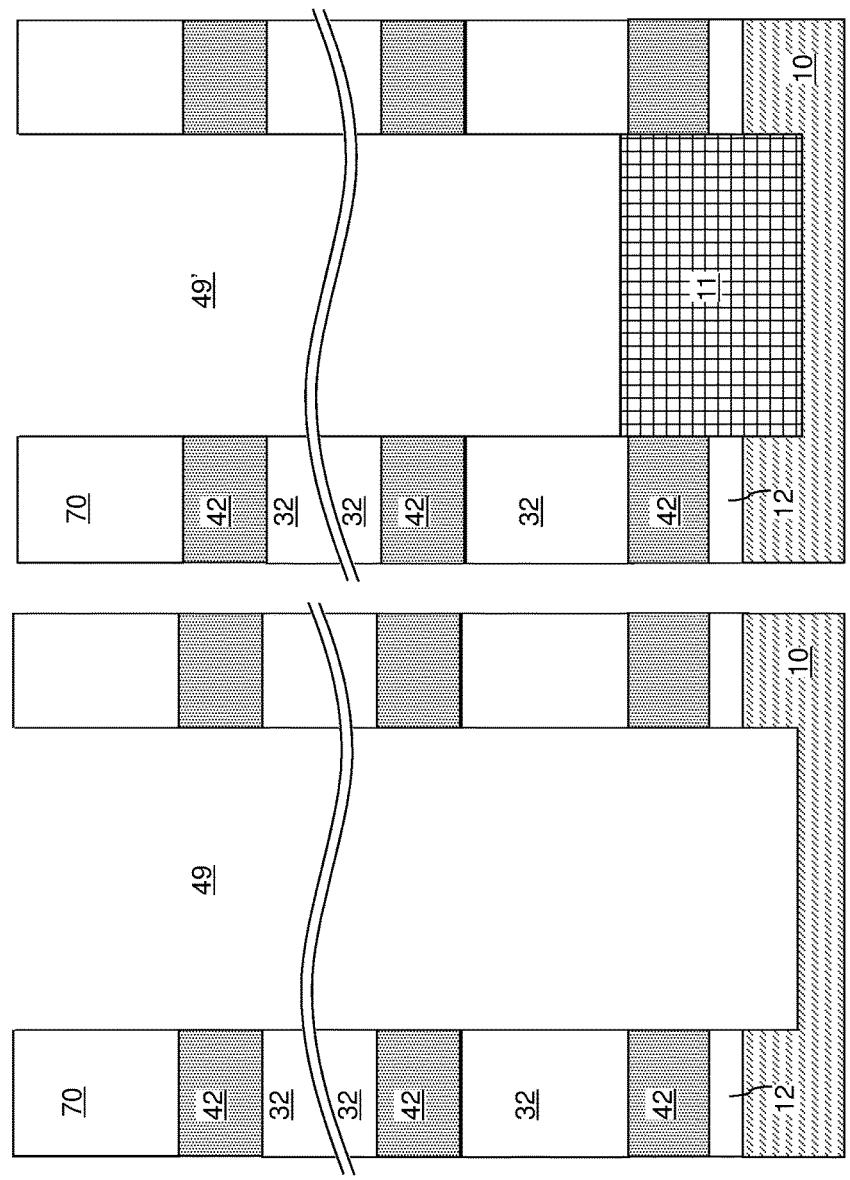

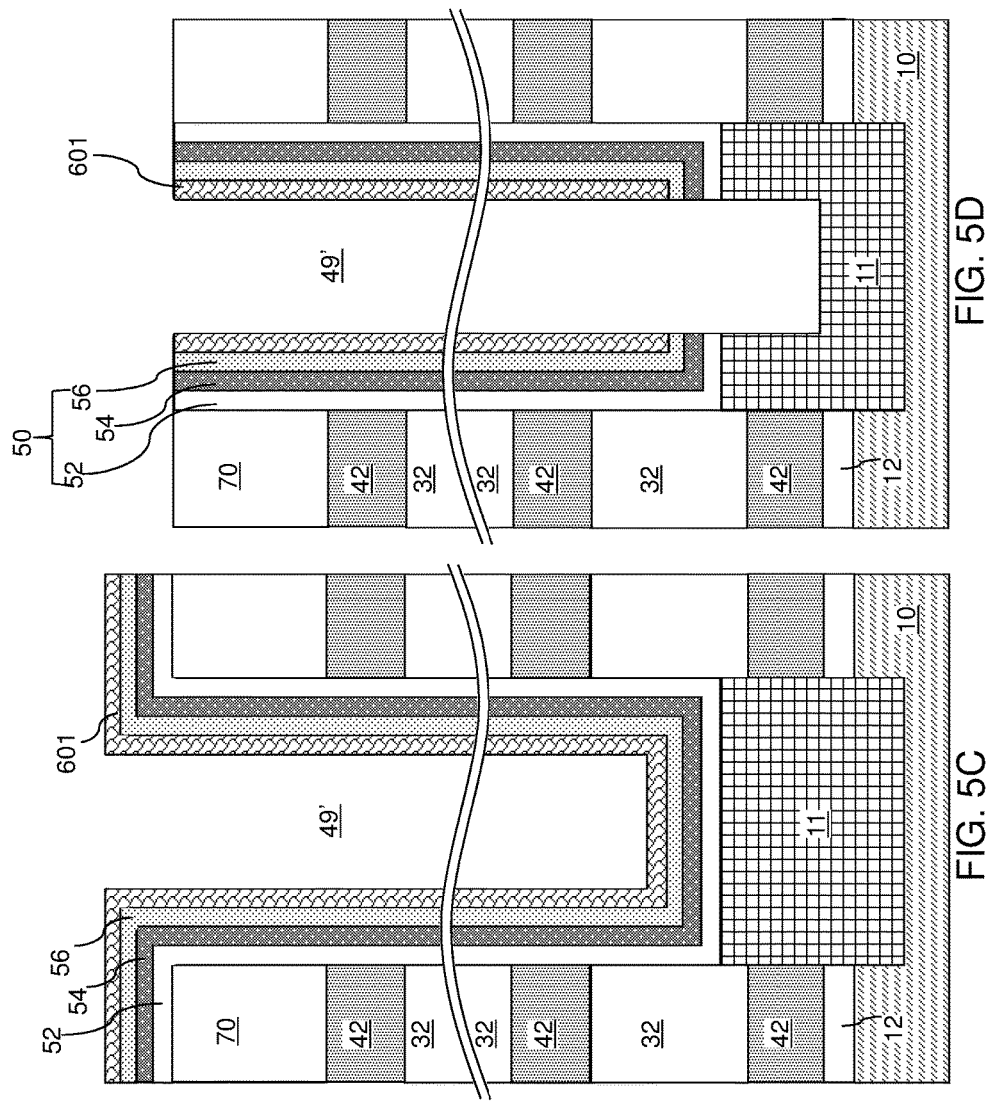

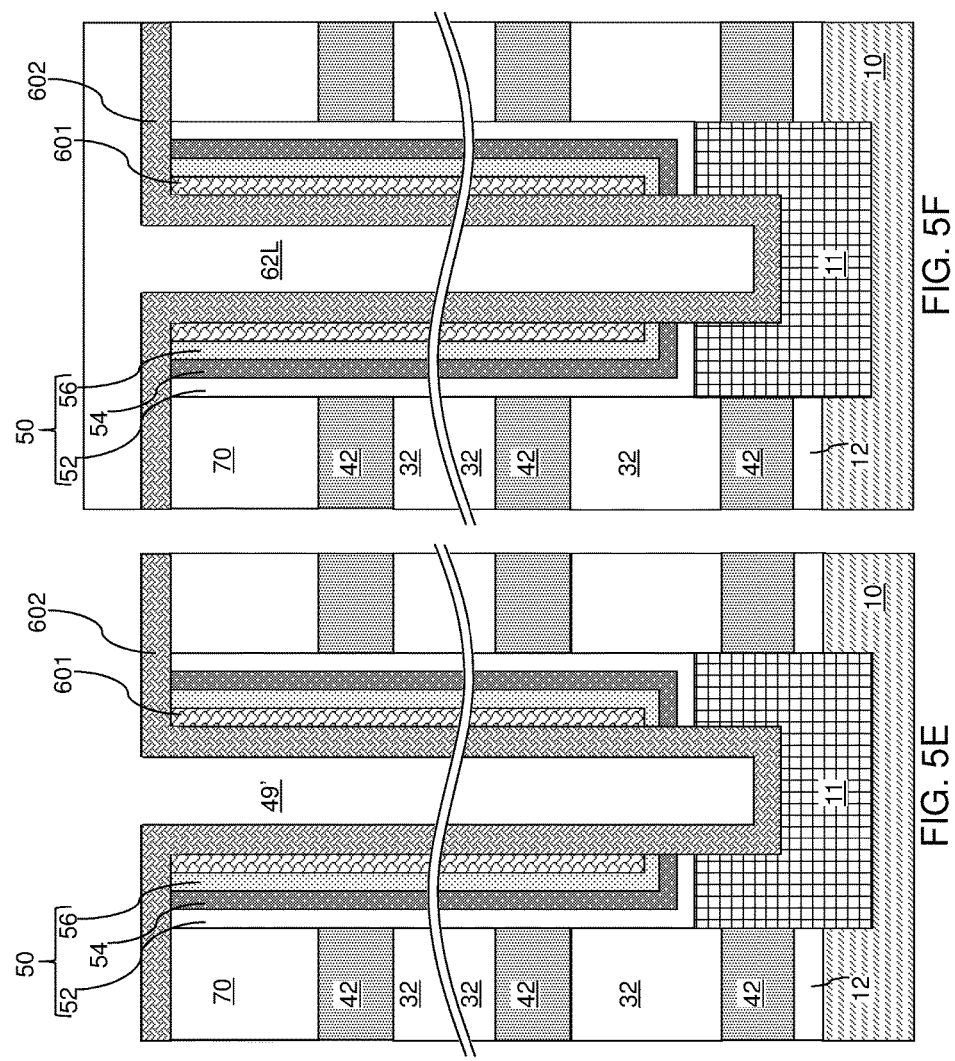

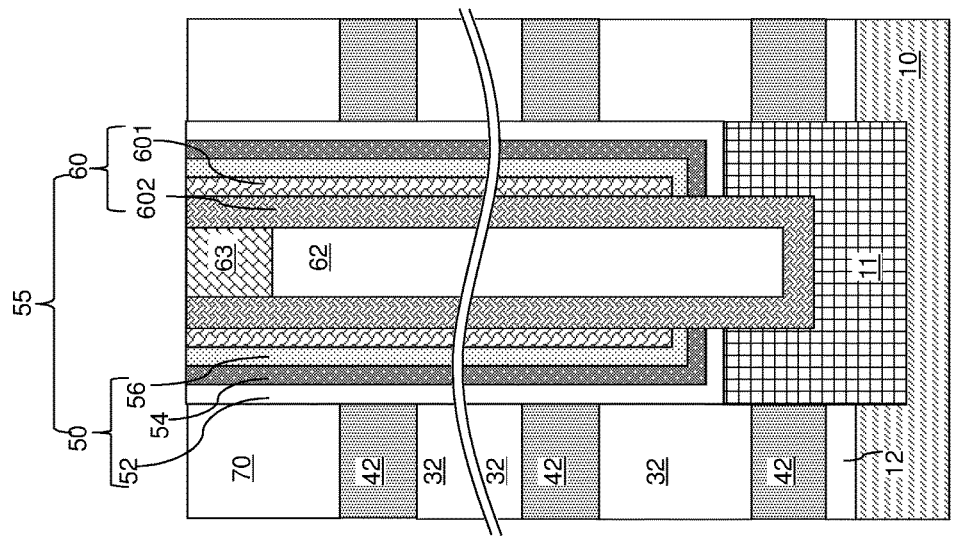
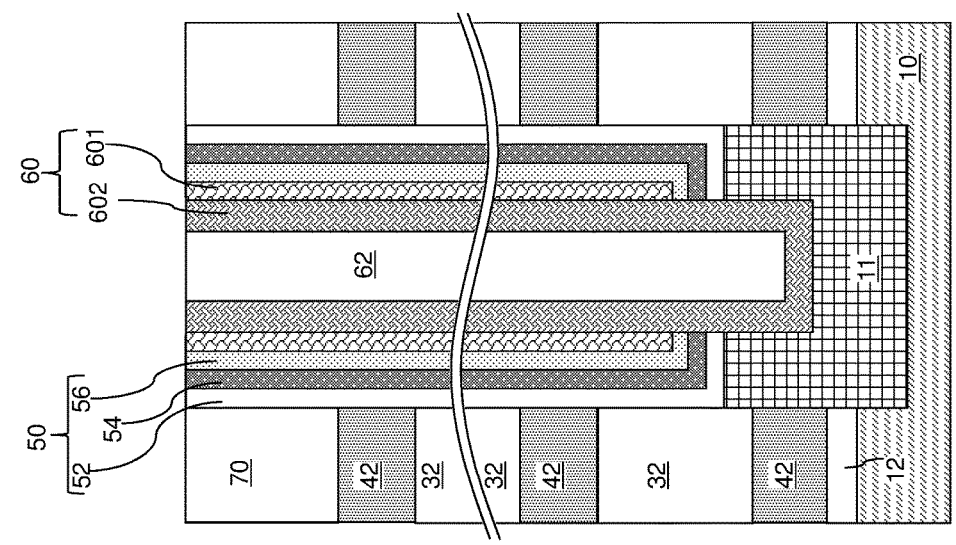

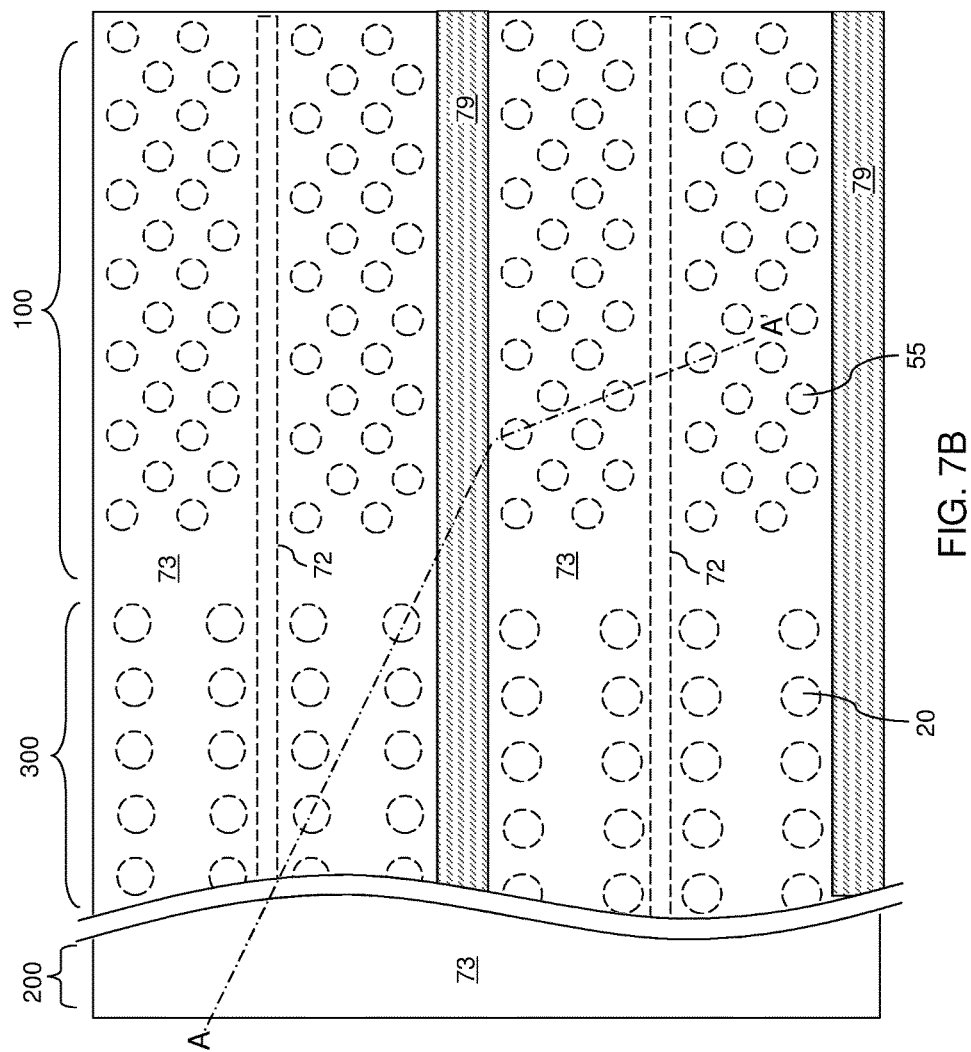

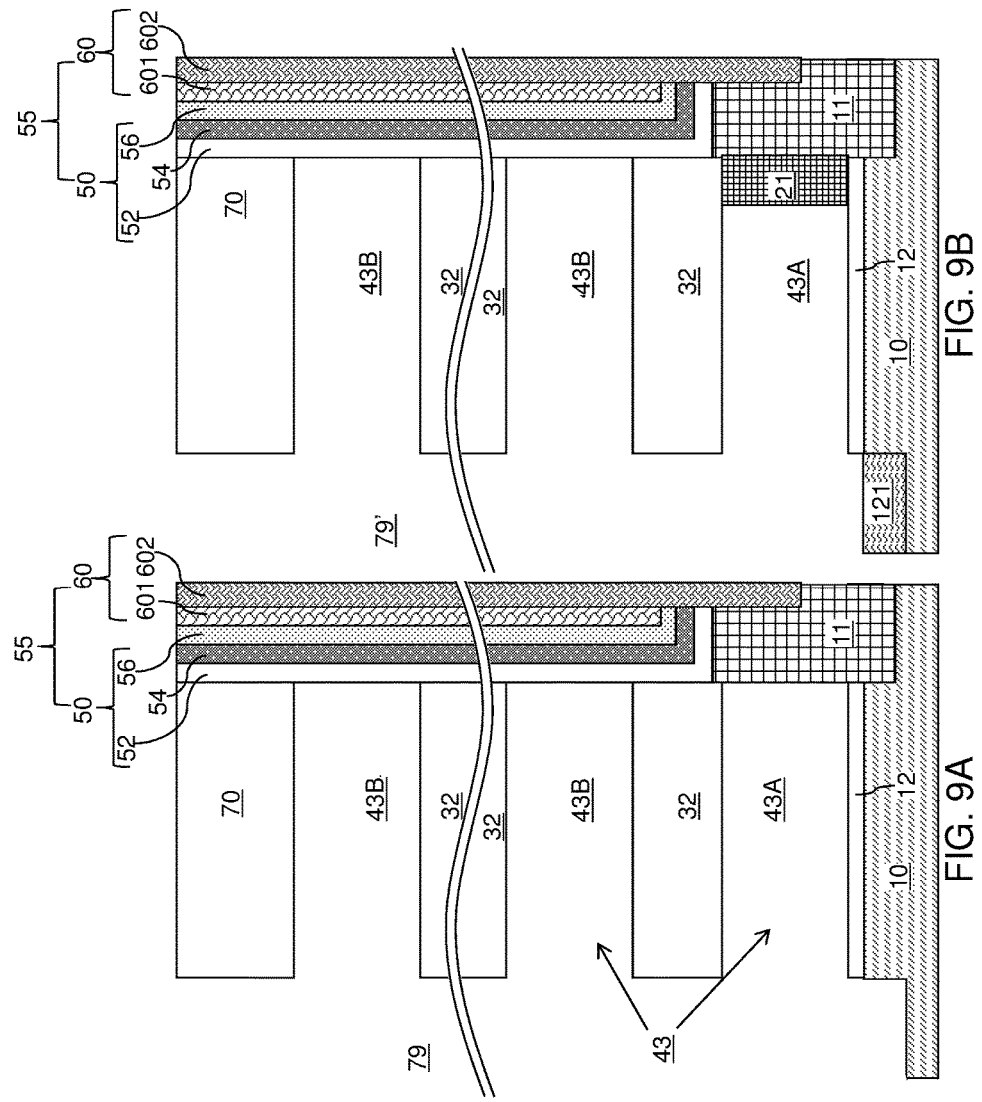

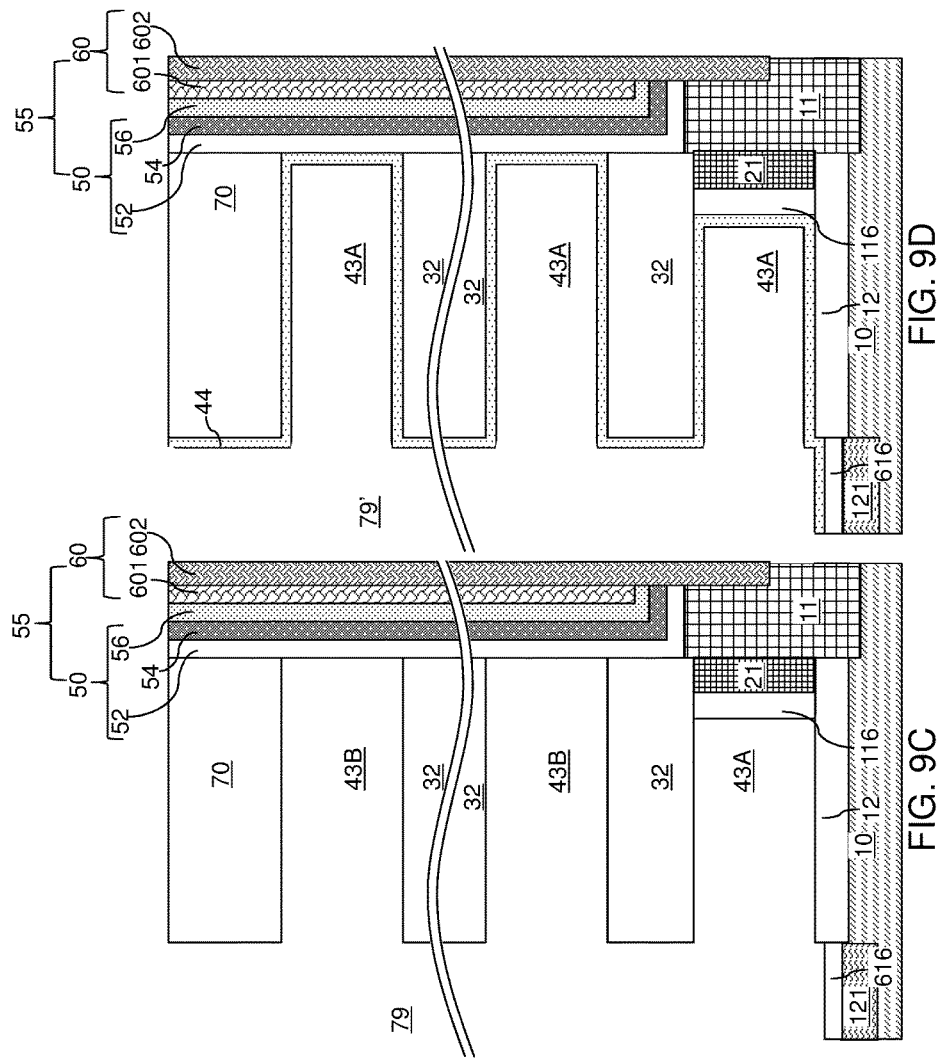

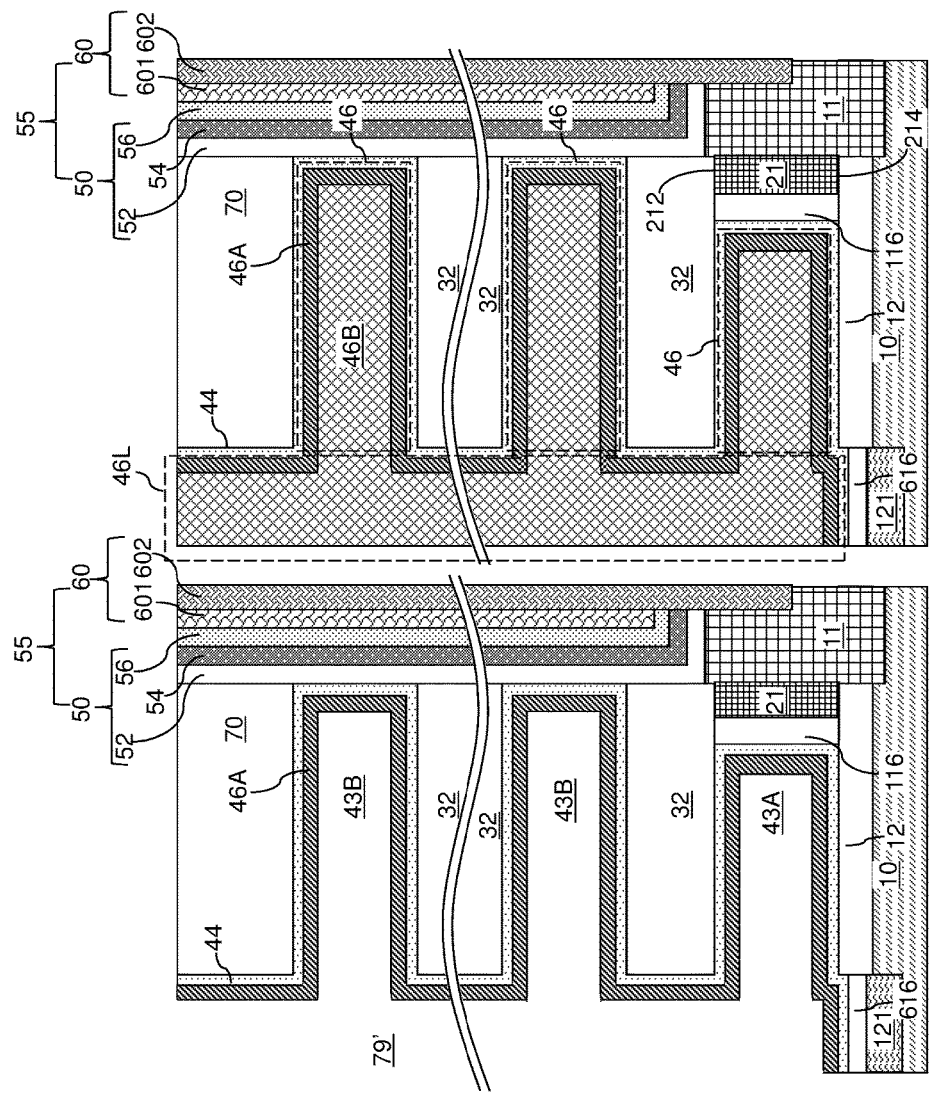

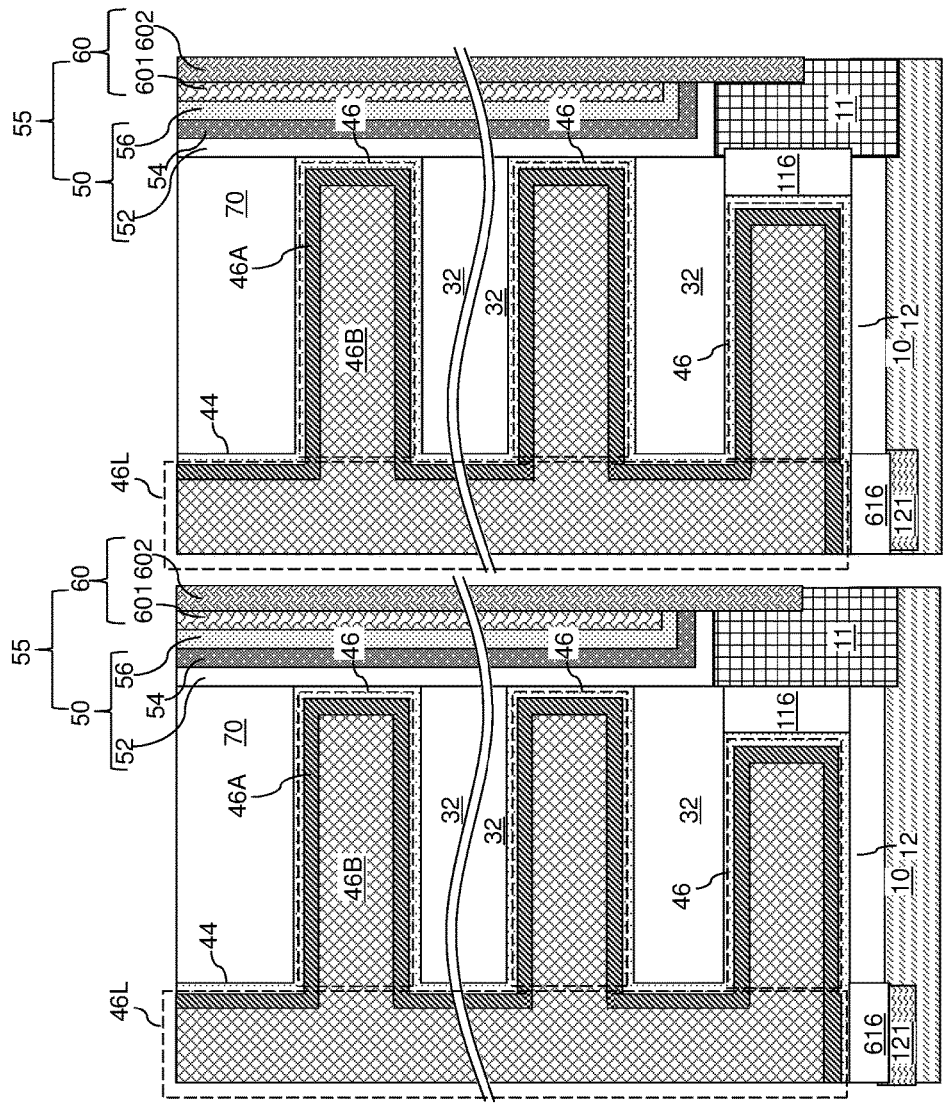

United States Patent 10,074,666 B2

THREE-DIMENSIONAL MEMORY DEVICE WITH ENHANCED MECHANICAL STABILITY SEMICONDUCTOR PEDESTAL AND METHOD OF MAKING THEREOF

FIELD

The present disclosure relates generally to the field of semiconductor devices, and particular to a three-dimensional memory device employing mechanically strengthened semiconductor pedestals and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; a memory opening extending through the alternating stack, wherein sidewalls of the memory opening comprise sidewalls of the insulating layers; a memory stack structure located inside the memory opening and comprising a memory film that contacts the sidewalls of the memory opening, and a vertical semiconductor channel contacting an inner sidewall of the memory film; and a semiconductor pedestal underlying the memory stack structure and located at a lowest level among the electrically conductive layers, wherein the semiconductor pedestal includes a laterally protruding semiconductor portion having an outer sidewall that is located farther outward from a vertical axis extending through a geometrical center of the memory stack structure than an outermost sidewall of the memory stack structure is from the vertical axis.

According to another aspect of the present disclosure, a method of forming a three-dimensional memory device is provided. An alternating stack of insulating layers and sacrificial material layers is formed over a substrate. A memory opening extending through the alternating stack is formed. A columnar semiconductor pedestal portion is formed at a bottom portion of the memory opening. A memory stack structure comprising a memory film and a vertical semiconductor channel is formed on the columnar semiconductor pedestal portion and inside the memory opening. The sacrificial material layers are removed to form backside recesses. A laterally protruding semiconductor portion is selectively grown directly on an outer sidewall of the columnar semiconductor pedestal portion within a volume of at least one of the backside recesses that is adjacent to the columnar semiconductor pedestal portion. A tubular semiconductor oxide spacer is formed by converting at least a surface portion of the laterally protruding semiconductor portion into a semiconductor oxide portion.

BRIEF DESCRIPTION OF THE DRAWINGS

FIG. 4A is a schematic vertical cross-sectional view of the exemplary structure after formation of memory openings and support openings according to an embodiment of the present disclosure.

FIGS. 5A-5H are sequential schematic vertical cross-sectional views of a memory opening within the exemplary structure up to the processing step of deposition of a second semiconductor channel layer according to an embodiment of the present disclosure.

FIG. 7B is a partial see-through top-down view of the exemplary structure of FIG. 7A. The vertical plane A-A' is the plane of the schematic vertical cross-sectional view of FIG. 7A.

FIGS. 9A-9F are sequential vertical cross-sectional views of a region of the exemplary structure during formation of a tubular semiconductor oxide spacer and electrically conductive layers according to an embodiment of the present disclosure.

FIG. 9G is a vertical cross-sectional view of a region of a first alternate configuration of the exemplary structure after formation of a tubular semiconductor oxide spacer and electrically conductive layers according to an embodiment of the present disclosure.

FIG. 9H is a vertical cross-sectional view of a region of a second alternate configuration of the exemplary structure after formation of a tubular semiconductor oxide spacer and electrically conductive layers according to an embodiment of the present disclosure.

DETAILED DESCRIPTION

Figure 1:
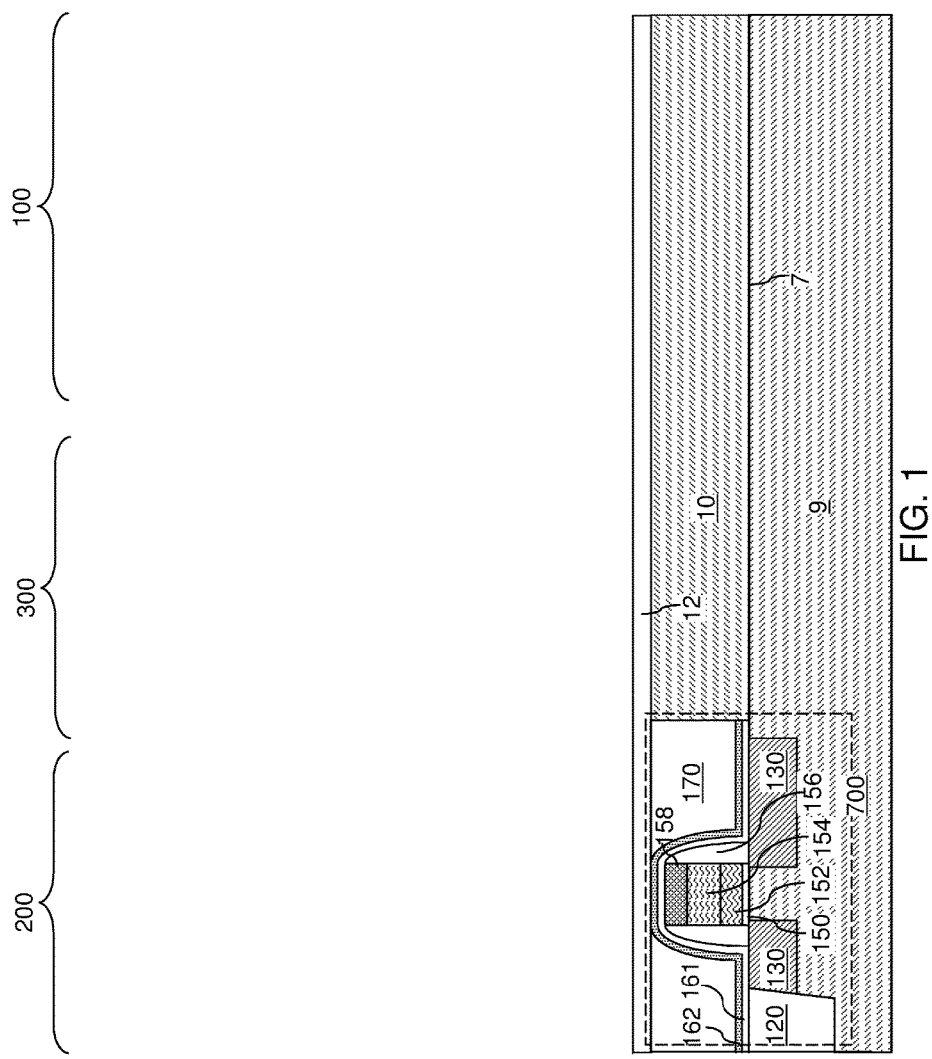
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

The various embodiments of the present disclosure can be employed to provide a three-dimensional memory structure including NAND strings overlying a semiconductor pedestal configured to provide enhanced mechanical strength and to avoid cracking and breakage and thus a resulting electrical discontinuity (i.e., partial or total open circuit) in the semiconductor pedestal.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
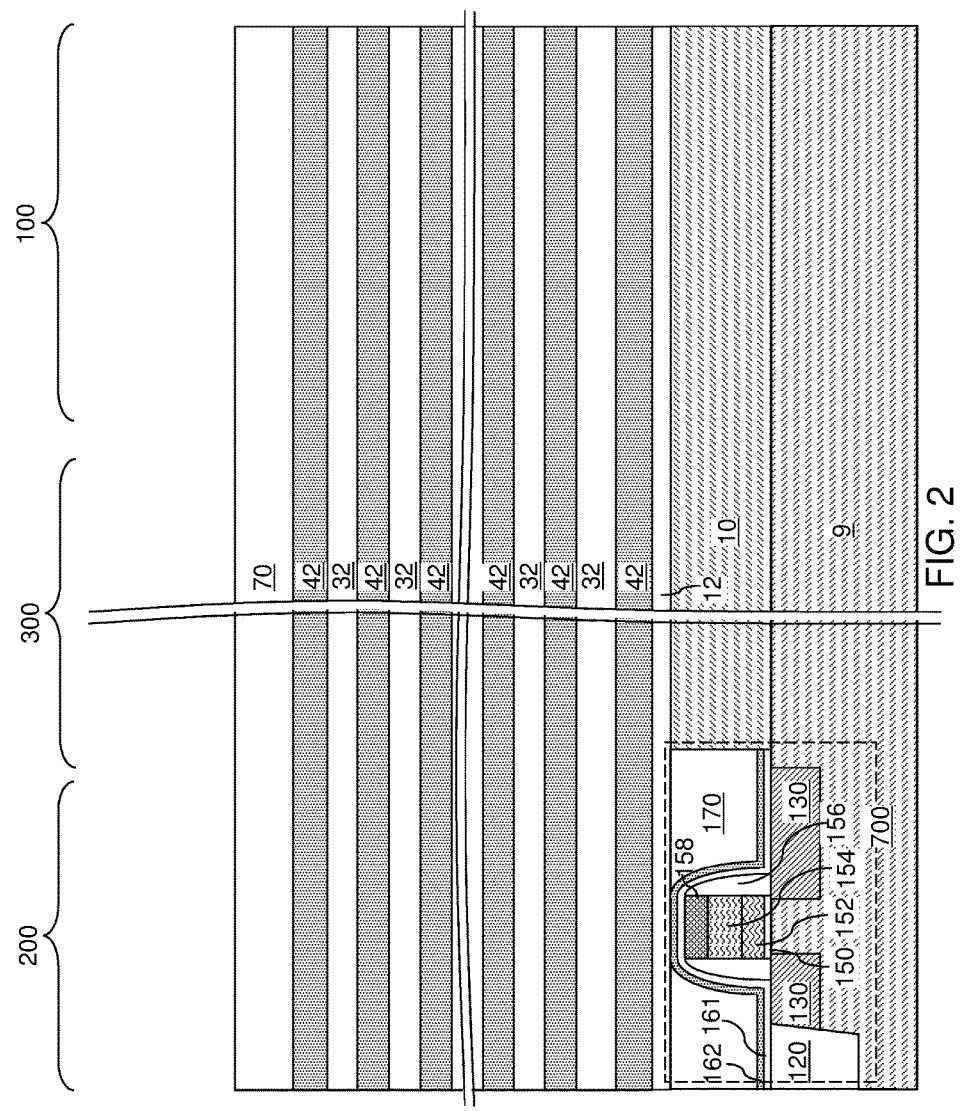
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. A non-limiting example of the second material includes silicon nitride. In one embodiment, the sacrificial material layers 42 can be spacer material layers that comprise silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
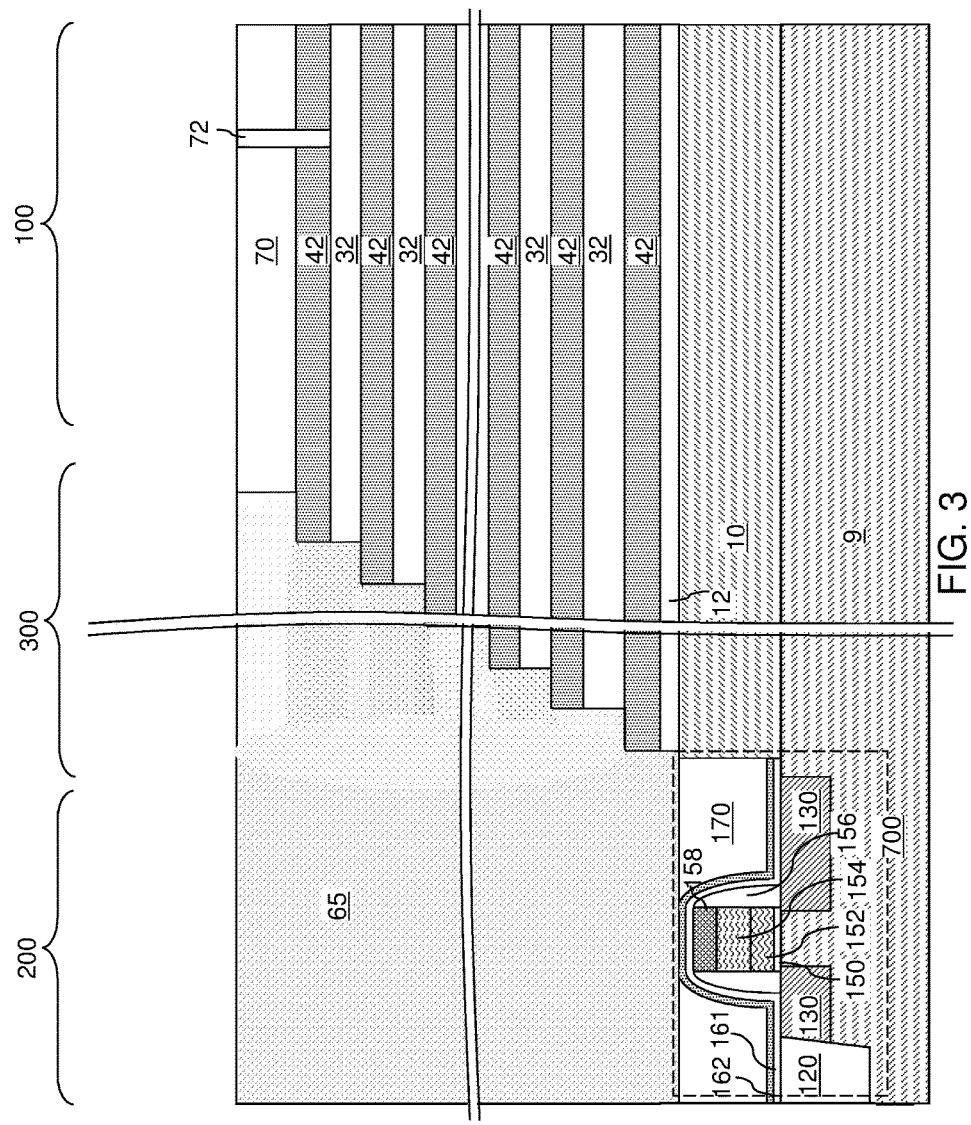
FIG. 3 is a schematic vertical cross-sectional view of the exemplary structure after formation of stepped terraces and a retro-stepped dielectric material portion and a dielectric isolation structure according to an embodiment of the present disclosure.

Referring to FIG. 3, a stepped cavity can be formed within the contact region 300 which is located between the memory array (i.e., device region) 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42). Each sacrificial material layer 42 other than the topmost sacrificial material layer 42 within the alternating stack (32, 42) laterally extends farther than any overlying sacrificial material layer 42 within the alternating stack (32, 42).

A retro-stepped dielectric material portion 65 (i.e., an insulating fill material portion) can be formed in the stepped cavity and over the terrace region by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4B:
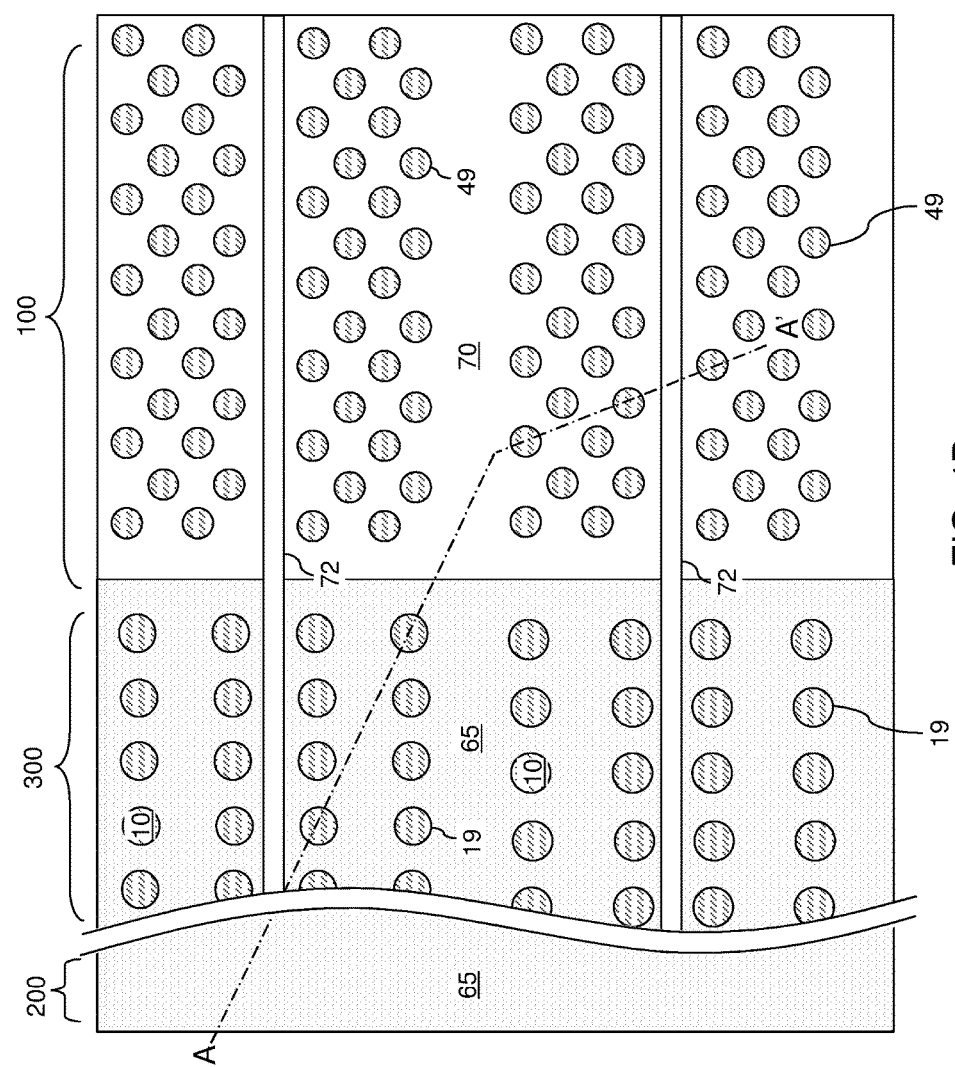
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), the gate dielectric layer 12, and optionally into an upper portion of the semiconductor material layer 10. At this processing step, each support opening 19 can extend through the retro-stepped dielectric material portion 65, a subset of layers in the alternating stack (32, 42), the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, a columnar semiconductor pedestal portion (e.g., an epitaxial pedestal) 11 can be formed at the bottom portion of each memory opening 49 and each support openings 19, for example, by a selective semiconductor deposition process. In a selective semiconductor deposition process, a reactant for deposition a semiconductor material and an etchant that etches the semiconductor material can be flowed into a process chamber simultaneously or alternately. The nucleation time (which is also referred to as incubation time) for formation of clusters of the semiconductor material on physically exposed semiconductor surfaces (such as the physically exposed surfaces of the semiconductor material layer 10) is less than the nucleation time for formation of clusters of the semiconductor material on physically exposed dielectric surfaces (such the physically exposed surfaces of the insulating layers 32 that can include silicon oxide and the physically exposed surface of the sacrificial material layers 42 that can include silicon nitride). Thus, the average deposition rate of the semiconductor material over a finite duration of time that is greater than the nucleation time of the dielectric surfaces is lower than the average deposition rate of the semiconductor material over the same duration of time for the semiconductor surfaces. By setting the flow rate of the etchant to provide an etch rate between the average deposition rate of the semiconductor material on the semiconductor surfaces and the average deposition rate of the semiconductor material on the dielectric surfaces, a selective semiconductor deposition process can induce net deposition of the semiconductor material only on the physically exposed semiconductor surfaces, and prevent deposition of the semiconductor material on the insulator surfaces.

In one embodiment, the selective semiconductor deposition process can employ a reactant including a Group IV semiconductor material such as silicon or germanium. For example, the reactant can include one or more of silane ($SiH_4$), dichlorosilane ($SiH_2Cl_2$), trichlorosilane ($SiHCl_3$), silicon tetrachloride ($SiCl_4$), disilane ($Si_2H_6$), germane ($GeH_4$), digermane ($Ge_2H_6$), or other semiconductor deposition precursors including at least one Group IV semiconductor atom. The etchant can include, for example, hydrogen chloride (HCl) in gas phase.

In one embodiment, the selective semiconductor deposition process can be a selective semiconductor epitaxy process. In a selective semiconductor epitaxy process, a single crystalline semiconductor material is deposited on a pre-existing single crystalline semiconductor material portion without inducing deposition on dielectric surfaces. In one embodiment, the semiconductor material layer 10 can include a single crystalline semiconductor material such as single crystalline silicon, and each columnar semiconductor pedestal portion 11 can comprise a single crystalline semiconductor material in epitaxial alignment with the single crystalline semiconductor material of the semiconductor material layer 10.

Alternatively, the selective semiconductor deposition process may deposit a polycrystalline or amorphous semiconductor material on pre-existing semiconductor surfaces. For example, the semiconductor material layer 10 can include a single crystalline semiconductor material, a polycrystalline semiconductor material, or an amorphous semiconductor material, and the selective semiconductor deposition process can deposit a polycrystalline or amorphous semiconductor material to form the columnar semiconductor pedestal portions 11. The crystallinity of the columnar semiconductor pedestal portions 11 can be determined by the process conditions of the selective semiconductor deposition process such as the process temperature and partial pressure of residual gas species (i.e., impurity gas species) in the process chamber.

The duration of the selective semiconductor deposition process can be selected such that the top surface of each columnar semiconductor pedestal portion 11 can be formed between the horizontal plane including the top surface of the bottommost sacrificial material layer 42 (if there is one source select gate electrode to be formed in the device) or a set of bottom sacrificial material layers 42 (if there are plural source select gate electrodes to be formed in the device) and the horizontal plane including the top surface of an insulating layer 32 located directly on top of the above described sacrificial material layer(s) 42. Each columnar semiconductor pedestal portion 11 can have a substantially same horizontal cross-sectional shape at this step. The sidewall of each columnar semiconductor pedestal portion 11 can have a closed periphery of a same shape irrespective of the height of the horizontal cross-section that generates the closed periphery at the intersection of the sidewall and the horizontal plane. In one embodiment, the horizontal cross-sectional shape of the columnar semiconductor pedestal portions 11 can be circular or elliptical.

In one embodiment, the columnar semiconductor pedestal portion 11 can be doped with electrical dopants of the same conductivity type as the semiconductor material layer 10. In one embodiment, the top surface of each columnar semiconductor pedestal portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the columnar semiconductor pedestal portions 11 with a respective conductive material layer.

The columnar semiconductor pedestal portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the columnar semiconductor pedestal portion 11. In one embodiment, the columnar semiconductor pedestal portion 11 can comprise single crystalline silicon. In one embodiment, the columnar semiconductor pedestal portion 11 can have a doping of the first conductivity type, which is the same as the conductivity type of the semiconductor material layer 10 that the columnar semiconductor pedestal portion contacts. If a semiconductor material layer 10 is not present, the columnar semiconductor pedestal portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer. As used herein, two surfaces are "vertically coincident" if there exists a vertical plane that includes the entirety of the two surfaces. The vertical plane may have a curvature along a horizontal direction, but does not have any curvature along the vertical direction.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the columnar semiconductor pedestal portion 11 (or a surface of the semiconductor material layer 10 in case the columnar semiconductor pedestal portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the columnar semiconductor pedestal portion 11 (or of the semiconductor substrate layer 10 in case columnar semiconductor pedestal portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the columnar semiconductor pedestal portion 11 or the semiconductor substrate layer 10 if portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a columnar semiconductor pedestal portion 11, a memory stack structure 55, a dielectric core 62, and a drain region 63 within a memory opening 49 is herein referred to as a memory opening fill structure (11, 55, 62, 63). Each combination of a columnar semiconductor pedestal portion 11, a memory film 50, a vertical semiconductor channel 60, a dielectric core 62, and a drain region 63 within each support opening 19 fills the respective support openings 19, and constitutes a support pillar structure 20 as shown in FIG. 6.

Figure 6:
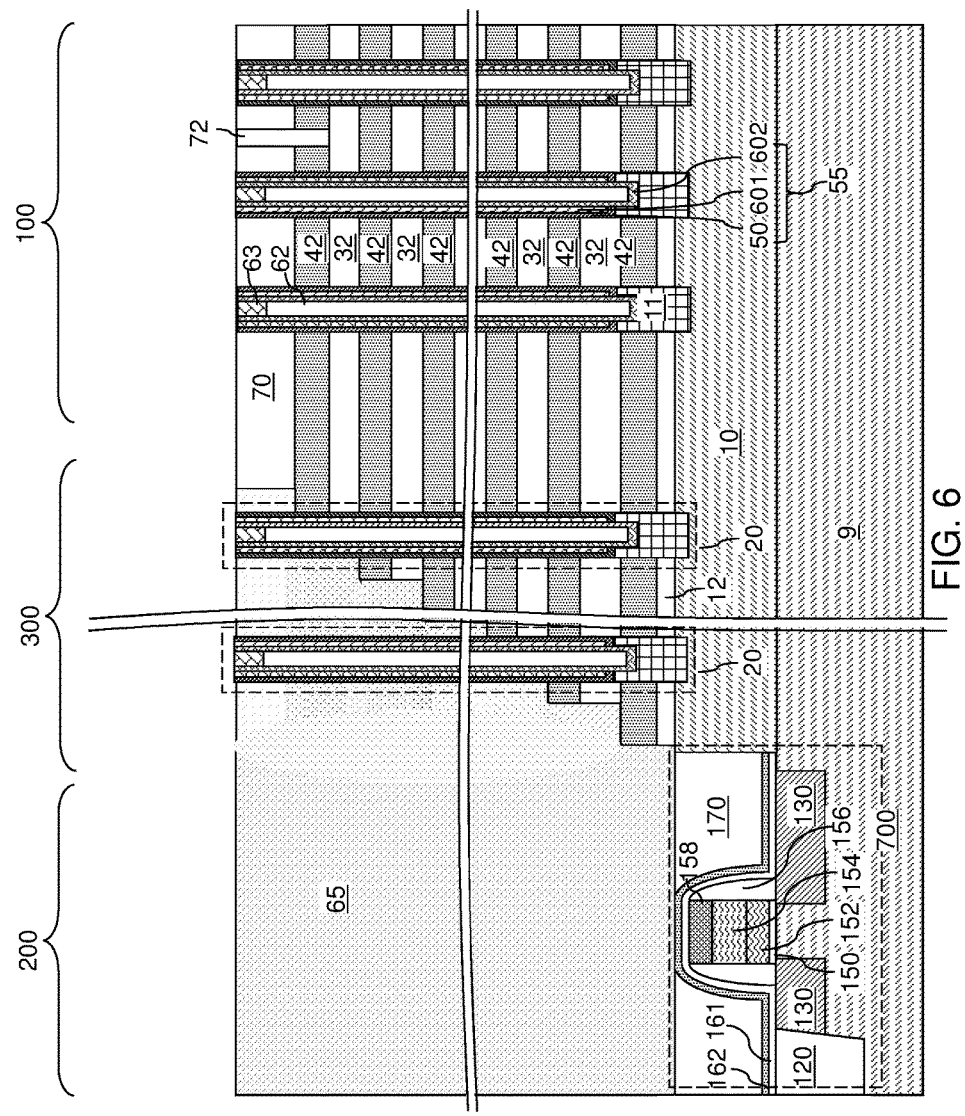
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structures 20 within the memory openings 49 and the support openings 19, respectively. An instance of a memory opening fill structure (11, 55, 62, 63) can be formed within each memory opening 49 of the structure of FIGS. 4A and 4B. Each instance of the memory stack structure 55 can be formed directly on a columnar semiconductor pedestal portion 11 and inside a respective memory opening. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

The sidewalls of each memory opening include sidewalls of the insulating layers 32. Each memory stack structure 55 comprises a memory film 50 that contacts sidewalls of the memory opening, and a vertical semiconductor channel 60 contacts an inner sidewall of each memory film 50. The support pillar structures 20 are formed through the retro-stepped dielectric material portion 65 and the stepped surfaces.

Figure 7A:
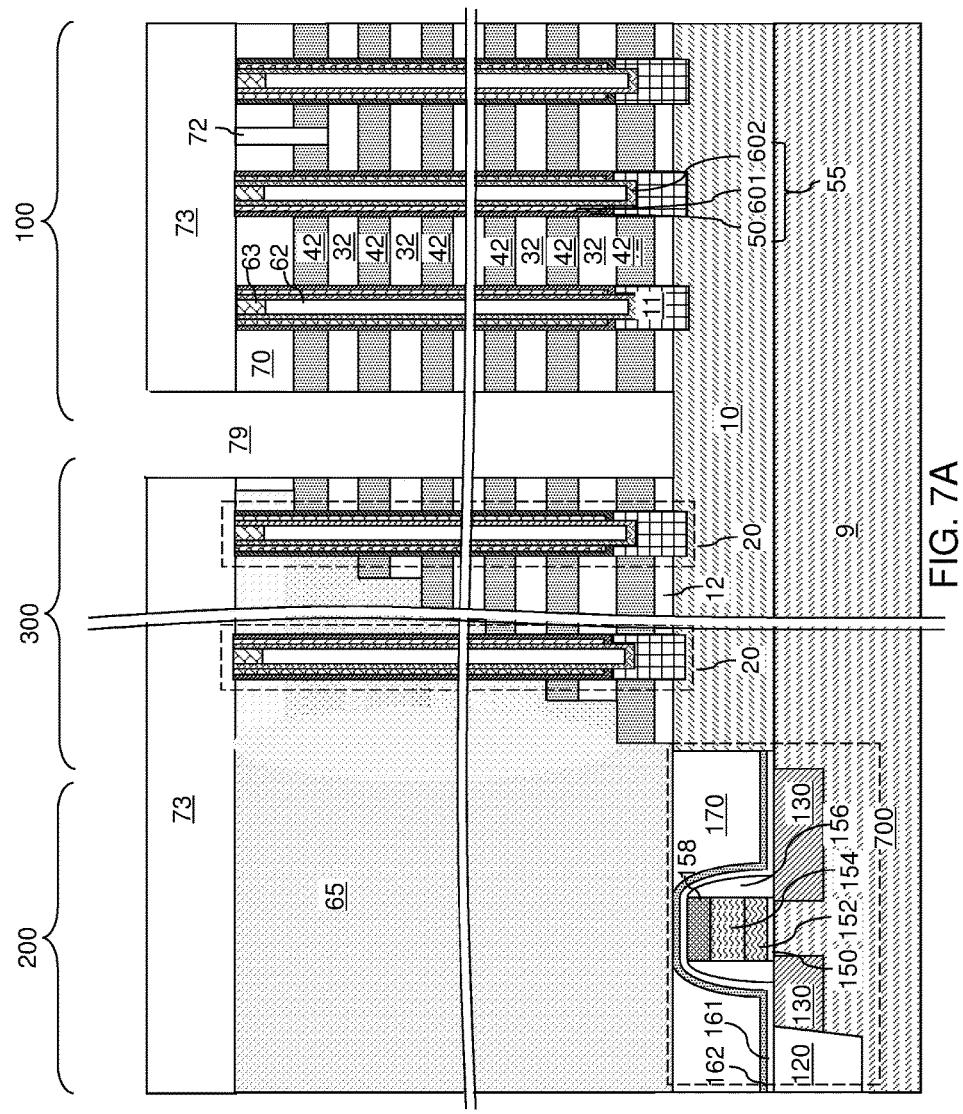
FIG. 7A is a schematic vertical cross-sectional view of the exemplary structure after formation of backside trenches according to an embodiment of the present disclosure.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 8:
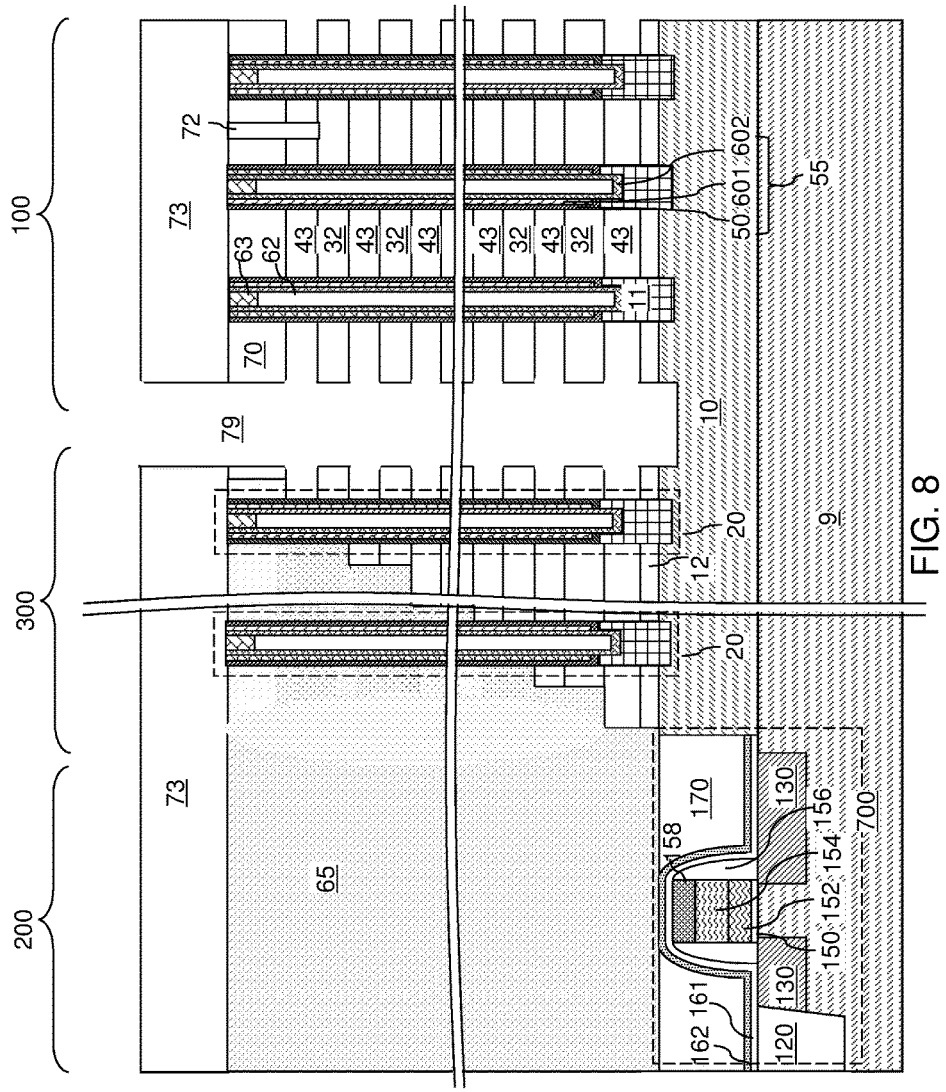
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Referring to FIG. 9B, a selective semiconductor deposition process is performed to grow a semiconductor material portion from the sidewalls of the columnar semiconductor pedestal portions 11. During the selective semiconductor deposition process, a semiconductor material grows from the sidewalls of the columnar semiconductor pedestal portions 11 to form annular semiconductor material portions, while the semiconductor material does not grow from the dielectric surfaces of the insulating layers 32 and the outer surfaces of the memory films 50 (e.g., from the outer surfaces of the blocking dielectric 52). In other words, the laterally protruding semiconductor portions 21 are formed by a selective semiconductor deposition process that deposits a semiconductor material on a semiconductor surface and does not deposit the semiconductor material on surfaces of dielectric materials, such as silicon oxide. Each of the annular semiconductor material portions laterally protrude outward into the backside recesses 43 from a continuous vertical plane that includes the entire sidewall of a respective columnar semiconductor pedestal portion 11 and a memory film 50 therein. Thus, each of the annular semiconductor material portions is herein referred to as a laterally protruding semiconductor portion 21. While only one laterally protruding semiconductor portion 21 is shown in FIG. 9B, in another embodiment, plural, vertically separated laterally protruding semiconductor portions 21 may extend from a single columnar semiconductor pedestal portion 11 if the portion 11 is exposed in more than one vertically separated backside recess 43. Thus, each vertically separated laterally protruding semiconductor portion 21 may laterally extend from a single columnar semiconductor pedestal portion 11 into respective backside recesses 43. A planar semiconductor portion 121 can grow from the physically exposed portion of the semiconductor material layer 10 underneath each backside trench 79 concurrently with growth of the laterally protruding semiconductor portions 21.

Each laterally protruding semiconductor portion 21 grows directly on an outer sidewall of a columnar semiconductor pedestal portion 11 within a volume of one of the backside recesses 43 that is adjacent to the columnar semiconductor pedestal portion 11, which can be a lowest level backside recess 43 bounded by the gate dielectric layer 12 and a bottommost insulating layer 32 (if only one source select gate electrode is to be formed in the device) or a set of bottom backside recesses 43 (if plural source select gate electrodes are to be formed in the device). In one embodiment, the selective semiconductor deposition process can employ a reactant including a Group IV semiconductor material such as silicon or germanium. The etchant can include, for example, hydrogen chloride (HCl) in gas phase.

In one embodiment, the selective semiconductor deposition process can be a selective semiconductor epitaxy process. In one embodiment, the columnar semiconductor pedestal portions 11 can include a single crystalline semiconductor material, such as single crystalline silicon, and each laterally protruding semiconductor portion 21 can comprise a single crystalline semiconductor material, such as single crystalline silicon, in epitaxial alignment with the single crystalline semiconductor material of a respective columnar semiconductor pedestal portion 11 that is laterally enclosed therein.

Alternatively, the selective semiconductor deposition process can deposit a polycrystalline or amorphous semiconductor material (e.g., polysilicon or amorphous silicon) to form the laterally protruding semiconductor portions 21. The crystallinity of the laterally protruding semiconductor portions 21 can be determined by the process conditions of the selective semiconductor deposition process such as the process temperature and partial pressure of residual gas species (i.e., impurity gas species) in the process chamber.

The lateral thickness of the laterally protruding semiconductor portions 21, as measured between an outer sidewall and a most proximate portion of an inner sidewall, can be uniform throughout the entire height of the laterally protruding semiconductor portions 21. In one embodiment, the lateral thickness of the laterally protruding semiconductor portions 21 can be in a range from 3% to 100%, such as from 10% to 50%, of the maximum lateral dimension of the columnar semiconductor pedestal portion 11 therein. In one embodiment, the lateral thickness of the laterally protruding semiconductor portions 21 can be in a range from 3 nm to 100 nm, although lesser and greater thicknesses can also be employed.

In one embodiment, the laterally protruding semiconductor portions 21 can be doped with electrical dopants of the same conductivity type as the columnar semiconductor pedestal portions 11. An inner portion of each laterally protruding semiconductor portion 21 may be subsequently employed as a portion of a transistor channel, or the entirety of each laterally protruding semiconductor portion 21 may be subsequently converted into a semiconductor oxide portion. Each continuous pair of a columnar semiconductor pedestal portion 11 and a laterally protruding semiconductor portion 21 constitutes a semiconductor pedestal (11, 21) consisting essentially of a semiconductor material.

Referring to FIG. 9C, physically exposed surface portions of the semiconductor pedestals (11, 21) and the semiconductor material layer 10 can be converted into semiconductor oxide portions by thermal and/or plasma oxidation of the semiconductor materials into semiconductor oxide materials. For example, an anneal in an oxidizing ambient is performed at an elevated temperature. The anneal may include a suitable ambient, such as steam, oxygen, ozone, water vapor and combination thereof. Water vapor is preferred. The structure is located into an enclosure (which may be a vacuum-tight enclosure), and water vapor is provided into the enclosure while the enclosure is maintained at the elevated temperature. The water vapor can be generated in-situ or ex-situ by a water vapor generator (WVG). The temperature of the anneal can be in a range from 600 degrees Celsius to 1,000 degrees Celsius, although lesser and greater temperatures can also be employed. The partial pressure of the water vapor during the anneal process can be in a range from 1 mTorr to 1 atm, and/or may be in a range from 10 mTorr to 100 Torr, although lesser and greater partial pressures can also be employed. The thermal and/or plasma oxidation converts at least surface portion of each laterally protruding semiconductor portion 21 into a tubular semiconductor oxide spacer 116, and each physically exposed surface portion of the planar semiconductor portion 121 into a planar semiconductor oxide portion 616. The tubular semiconductor oxide spacer 116 functions as a gate dielectric of a source select gate of a source side select transistor. In one embodiment, each tubular semiconductor oxide spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular semiconductor oxide spacers 116 include a dielectric oxide material that includes the same semiconductor element as the semiconductor pedestals (11, 21) and additionally includes oxygen. In one embodiment, the tubular semiconductor oxide spacers 116 can include a dielectric oxide (e.g., silicon oxide) of the semiconductor material of the laterally protruding semiconductor portion 21. Likewise, each planar semiconductor oxide portion 616 includes a dielectric oxide material that includes the same semiconductor element as the semiconductor material layer 10 (and/or planar semiconductor portion 121) and oxygen. In one embodiment, the planar semiconductor oxide portions 616 can include a dielectric oxide (e.g., silicon oxide) of the semiconductor material of the semiconductor material layer 10 and/or the planar semiconductor portion 121.

In one embodiment, only an outer region of each laterally protruding semiconductor portion 21 can be converted into a respective tubular semiconductor oxide spacer 116, while an inner region of each laterally protruding semiconductor portion 21 remains unoxidized by the oxidation process. In this case, a nested structure including a tubular semiconductor oxide spacer 116 and a laterally protruding semiconductor portion 21 (as reduced in thickness by the oxidation process) laterally surrounds each columnar semiconductor pedestal portion 11. In other words, a tubular semiconductor oxide spacer 116 laterally surrounds each semiconductor pedestal (11, 21). Thus, a tubular semiconductor oxide spacer 116 laterally surrounds each columnar semiconductor pedestal portion 11. The lateral thickness of each tubular semiconductor oxide spacer 116 (as measured between a vertical outer sidewalls and a most proximate portion of an inner sidewall) can be in a range from 1 nm to 20 nm, such as from 3 nm to 10 nm, although lesser and greater thicknesses can also be employed.

Referring to FIG. 9D, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular semiconductor oxide spacers 116 and the planar semiconductor oxide portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The thickness of the backside blocking dielectric layer 44 can be in a range from 1 nm to 10 nm, although lesser and greater thicknesses can also be employed. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar semiconductor oxide portion 616. A backside cavity 79' is present within the portion of each backside trench 79 that is not filled with the backside blocking dielectric layer 44. The backside blocking dielectric layer 44 can be formed directly on the insulating layers 32 and the tubular semiconductor oxide spacers 116.

Referring to FIG. 9E, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
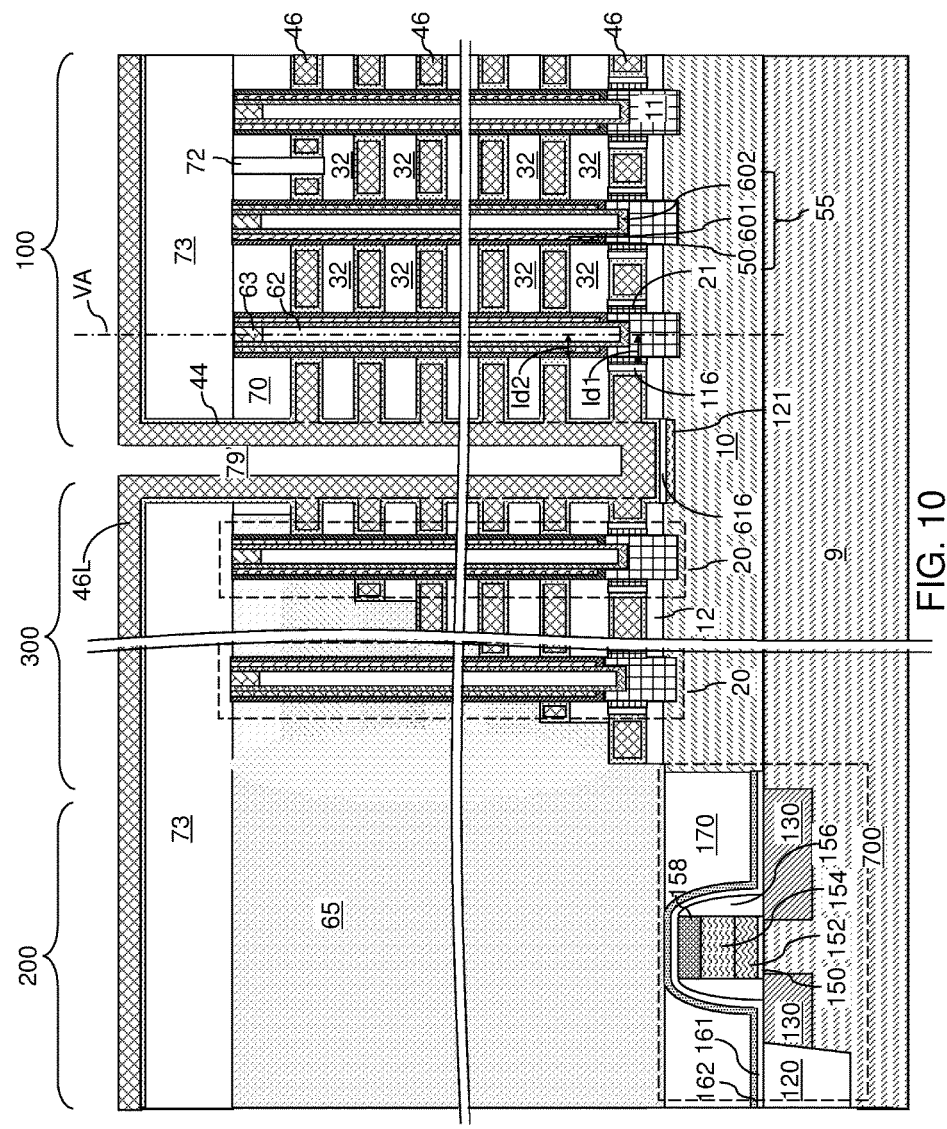
FIG. 10 is a schematic vertical cross-sectional view of the exemplary structure at the processing step of FIG. 9F.

Referring to FIGS. 9F and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular semiconductor oxide spacer 116 laterally surrounds a semiconductor pedestal (11, 21). A bottommost electrically conductive layer 46 laterally surrounds each tubular semiconductor oxide spacer 116 upon formation of the electrically conductive layers 46.

Thus, the electrically conductive layers 46 can be formed in the backside recesses 43 after formation of the tubular semiconductor oxide spacers 116 by depositing at least one conductive material therein. The electrically conductive layers 46 can be formed on the backside blocking dielectric layer 44 in remaining volumes of the backside recesses 43. The backside blocking dielectric layer 44 can be formed between each neighboring pair of an electrically conductive layer 46 and an insulating layer 32, and extends from a bottommost layer within the alternating stack (32, 46) of the insulating layers 32 and the electrically conductive layers 46 to a topmost layer within the alternating stack (32, 46).

In one embodiment, a bottom portion of the vertical semiconductor channel 60 can protrude into an upper center portion of the semiconductor pedestal (11, 21). In one embodiment, a first annular horizontal surface 212 of the semiconductor pedestal (11, 21) that is adjoined to the outer sidewall of the laterally protruding semiconductor portion 21 is in physical contact with a horizontal bottom surface of one of the insulating layers 32 (which can be a bottommost insulating layer 32), and a second annular horizontal surface 214 of the semiconductor pedestal (11, 21) that is adjoined to the outer sidewall of the laterally protruding semiconductor portion 21 is in physical contact with a horizontal top surface of a dielectric material layer underlying a bottommost layer among the electrically conductive layers 46.

In one embodiment, a topmost surface of the semiconductor pedestal (11, 21) is located above a horizontal plane including the first annular horizontal surface 212 of the semiconductor pedestal (11, 21) and within an area defined by a periphery of the sidewalls of the memory opening 49, and a bottommost surface of the semiconductor pedestal (11, 21) is located below a horizontal plane including the second annular horizontal surface 214 of the semiconductor pedestal (11, 21) and within the area defined by the periphery of the sidewalls of the memory opening 49.

The duration of the oxidation process that converts the semiconductor material of the laterally protruding semiconductor portions 21 into the tubular semiconductor oxide spacers 116 may be selected such that the oxidation process converts only an outer region of each laterally protruding semiconductor portion 21, an entirety of each laterally protruding semiconductor portion 21 but not the columnar semiconductor pedestal portions 11, or the entirety of each laterally protruding semiconductor portion 21 and an outer region of each columnar semiconductor pedestal portion 11.

In one embodiment, the laterally protruding semiconductor portion 21 can have a uniform lateral thickness throughout (as measured between the outer sidewall and a most proximal portion of the inner sidewall). Alternatively, the laterally protruding semiconductor portion 21 can have a curved outer sidewalls and a non-uniform lateral thickness. In one embodiment, the laterally protruding semiconductor portion 21 can have a different material composition than the columnar semiconductor pedestal portion 11. In one embodiment, the entirety of the vertical interface between the laterally protruding semiconductor portion 21 and the columnar semiconductor pedestal 11 can be vertically coincident with the sidewalls of the memory opening 49.

Thus, in one embodiment, all sacrificial material layers 42 in the alternating stack have the same composition, and removing the sacrificial material layers 42 to form backside recesses 43 comprises removing all sacrificial material layers 42 from the alternating stack at the same time (i.e., in the same etching step) to expose sidewalls of the memory film 50 and the columnar semiconductor pedestal portion 11. At least one lower backside recess 43A exposes a sidewall of the columnar semiconductor pedestal portion 11 while the remaining upper backside recesses 43B expose the sidewall of the memory film 50 (e.g., the sidewall of the blocking dielectric 52), as shown in FIG. 9A.

At least one laterally protruding semiconductor portion 21 is selectively grown, such as selectively epitaxially grown directly on an outer sidewall of the columnar semiconductor pedestal portion 11 within a volume of at least one of lower backside recesses 43A that exposes a sidewall of the columnar semiconductor pedestal portion 11 while not growing the laterally protruding semiconductor portion 21 from the exposed sidewall of the memory film 50 in remaining upper backside recesses 43B by a selective semiconductor deposition process that deposits a semiconductor material on a semiconductor surface and does not deposit the semiconductor material on surfaces of dielectric materials.

The subsequently formed semiconductor oxide portion 116 comprises a gate dielectric for at least one source select gate electrode 46 formed in the lower backside recesses 43A and while control gate electrodes and drain select gate electrodes 46 are formed in the upper backside recesses 43B in the same deposition step as the at least one source select electrode.

In one embodiment, an inner portion of each laterally protruding semiconductor portion 21 remains as a semiconductor material portion after formation of the tubular semiconductor oxide spacers 116 as illustrated in FIGS. 9C-9F and 10. In this case, a nested structure including a tubular semiconductor oxide spacer 116 and a laterally protruding semiconductor portion 21 (as reduced in thickness by the oxidation process) laterally surrounds each columnar semiconductor pedestal portion 11. In other words, a tubular semiconductor oxide spacer 116 laterally surrounds each semiconductor pedestal (11, 21). Thus, the tubular semiconductor oxide spacer 116 also laterally surrounds each columnar semiconductor pedestal portion 11 that is located in each semiconductor pedestal (11, 21).

As shown in FIG. 10, each laterally protruding semiconductor portion 21 can have an outer sidewall that is located farther outward from a vertical axis VA extending through a geometrical center of the memory stack structure 55 than an outermost sidewall of the memory stack structure 55 is from the vertical axis VA. For example, the first lateral distance ld1 between an outer sidewall of a laterally protruding semiconductor portion 21 of a semiconductor pedestal (11, 21) underlying a memory stack structure 55 and the vertical axis VA extending through the geometrical center of the memory stack structure 55 can be greater than the second lateral distance ld2 between an outer sidewall of the memory stack structure 55 and the vertical axis VA extending through the geometrical center of the memory stack structure 55. As used herein, a "geometrical center" of an element refers to the location of the center of mass of a hypothetical object occupying the same volume as the element in space and having a homogeneous density throughout.

Alternatively, as illustrated in FIG. 9G, the duration of the oxidation process that converts the semiconductor material of the laterally protruding semiconductor portions 21 into the tubular semiconductor oxide spacers 116 may be selected such that the oxidation process converts the entirety of each laterally protruding semiconductor portion 21 but not the columnar semiconductor pedestal portions 11. In this case, each tubular semiconductor oxide spacer 116 can be formed by converting the entirety of a laterally protruding semiconductor portion 21 into a respective tubular semiconductor oxide spacer 116. In this case, each semiconductor pedestal 11 consists of a respective columnar semiconductor pedestal portion 11, and each tubular semiconductor oxide spacer 116 laterally surrounds, and contacts a sidewall of, the respective columnar semiconductor pedestal portion 11.

Yet alternatively, as illustrated in FIG. 9H, the duration of the oxidation process that converts the semiconductor material of the laterally protruding semiconductor portions 21 into the tubular semiconductor oxide spacers 116 may be selected such that the oxidation process converts the entirety of each laterally protruding semiconductor portion 21 and an outer region of each columnar semiconductor pedestal portion 11. In this case, each tubular semiconductor oxide spacer 116 can be formed by converting the entirety of a laterally protruding semiconductor portion 21 and an outer region of a respective columnar semiconductor pedestal portion 11 into a respective tubular semiconductor oxide spacer 116. In this case, each semiconductor pedestal 11 consists of a respective remaining columnar semiconductor pedestal portion 11, and each tubular semiconductor oxide spacer 116 laterally surrounds, and contacts a sidewall of, the respective remaining columnar semiconductor pedestal portion 11. In other words, each tubular semiconductor oxide spacer 116 is formed by converting the entirety of a respective laterally protruding semiconductor portion 21 into a semiconductor oxide portion and by converting an outer portion of a respective columnar semiconductor pedestal portion 11 into an additional semiconductor oxide portion.

Figure 11:
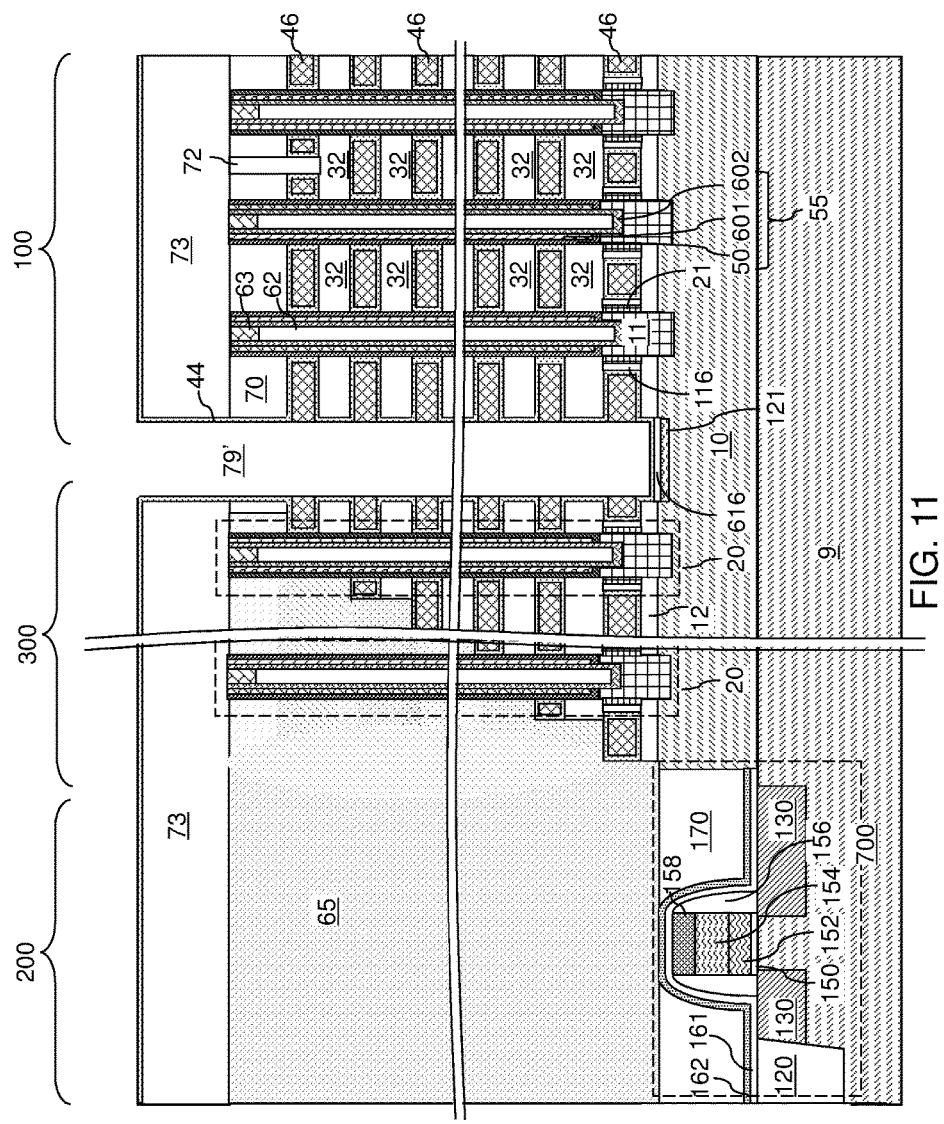
FIG. 11 is a schematic vertical cross-sectional view of the exemplary structure after removal of a deposited conductive material from within the backside trench according to an embodiment of the present disclosure.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. The gate dielectric layer 12 can be vertically spaced from the backside trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside trench 79 depending on whether the gate dielectric layer 12 is not removed or partially removed during removal of the continuous electrically conductive material layer 46L. In one embodiment, a top surface of the planar semiconductor oxide portion 616 can be physically exposed at the bottom of the backside trench 79 after removal of the continuous electrically conductive material layer 46L. A backside cavity 79' is present within each backside trench 79.

Figure 12A:
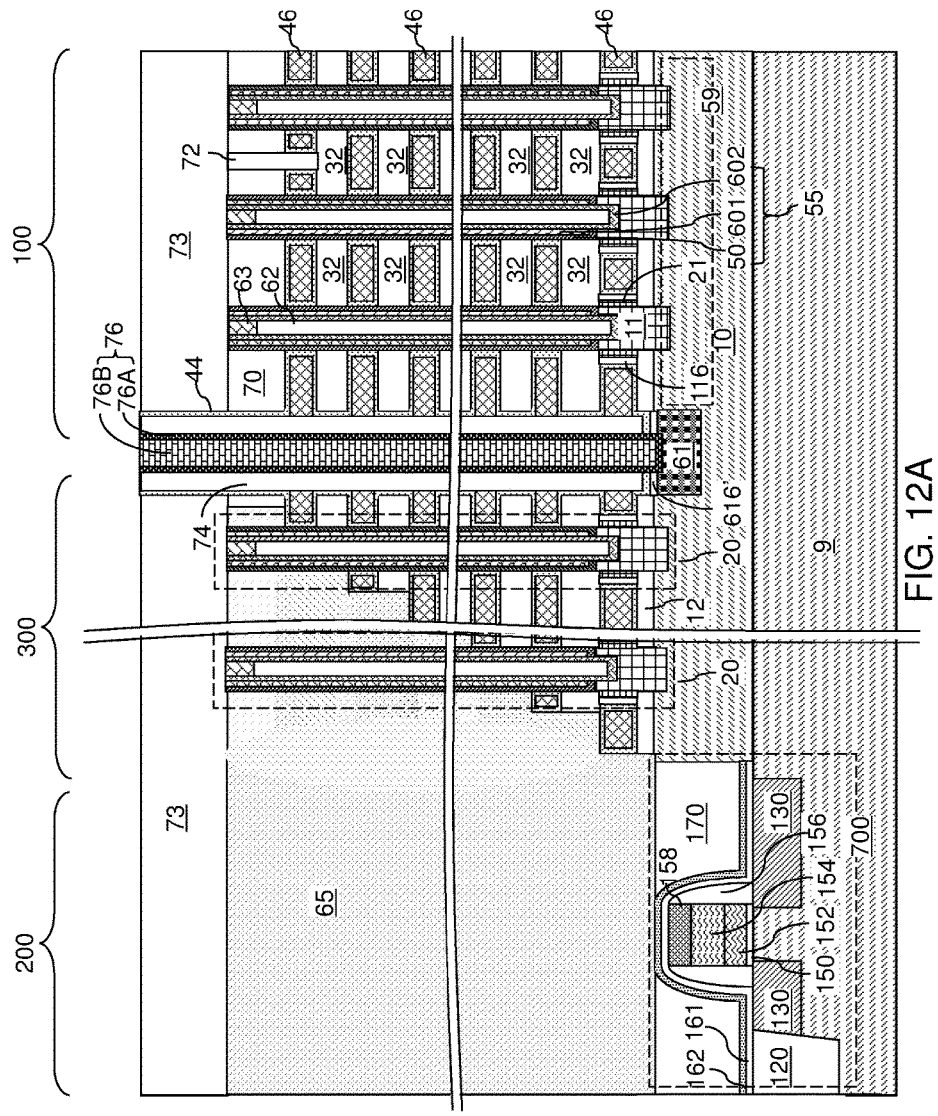
FIG. 12A is a schematic vertical cross-sectional view of the exemplary structure after formation of an insulating spacer and a backside contact structure according to an embodiment of the present disclosure.
Figure 12B:
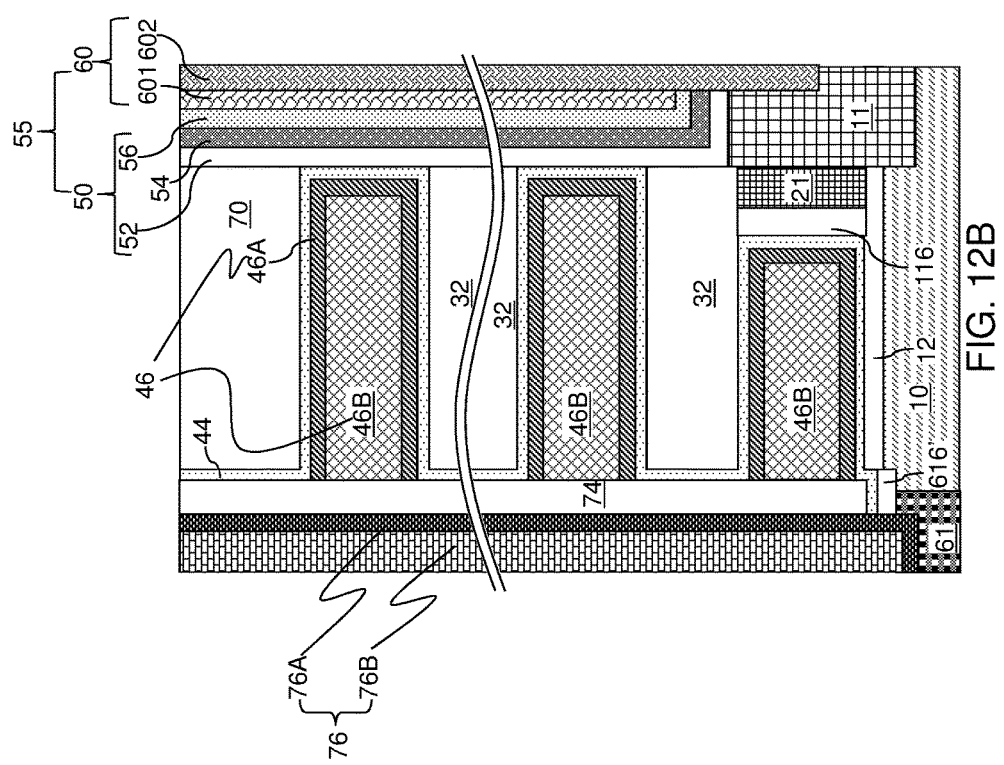
FIG. 12B is a magnified view of a region of the exemplary structure of FIG. 12A.

Referring to FIGS. 12A and 12B, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar semiconductor oxide portion 616 that underlies the opening through the insulating spacer 74. An opening is formed though the planar semiconductor oxide portion 616 underneath each backside cavity 79', thereby vertically extending the backside cavity 79'. A top surface of the semiconductor material layer 10 and/or planar semiconductor portion 121 can be physically exposed at the bottom of each backside trench 79. The remaining portion of each planar semiconductor oxide portion 616 is herein referred to as an annular semiconductor oxide portion 616', which can include a dielectric oxide of the semiconductor material of the semiconductor material layer 10 and/or planar semiconductor portion 121, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10 and/or planar semiconductor portion 121. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of semiconductor pedestals (11, 21) constitutes a horizontal semiconductor channel 59 for a plurality of field effect transistors. The horizontal semiconductor channel 59 is connected to multiple vertical semiconductor channels 60 through respective semiconductor pedestals (11, 21). The horizontal semiconductor channel 59 contacts the source region 61 and the plurality of semiconductor pedestals (11, 21). One or more bottommost electrically conductive layers 46 provided upon formation of the electrically conductive layers 46 within the alternating stack (32, 46) can comprise one or more source select gate electrodes for the field effect transistors and one or more adjacent tubular semiconductor oxide spacers 116 function as a the gate dielectric of the respective source select gate electrodes. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
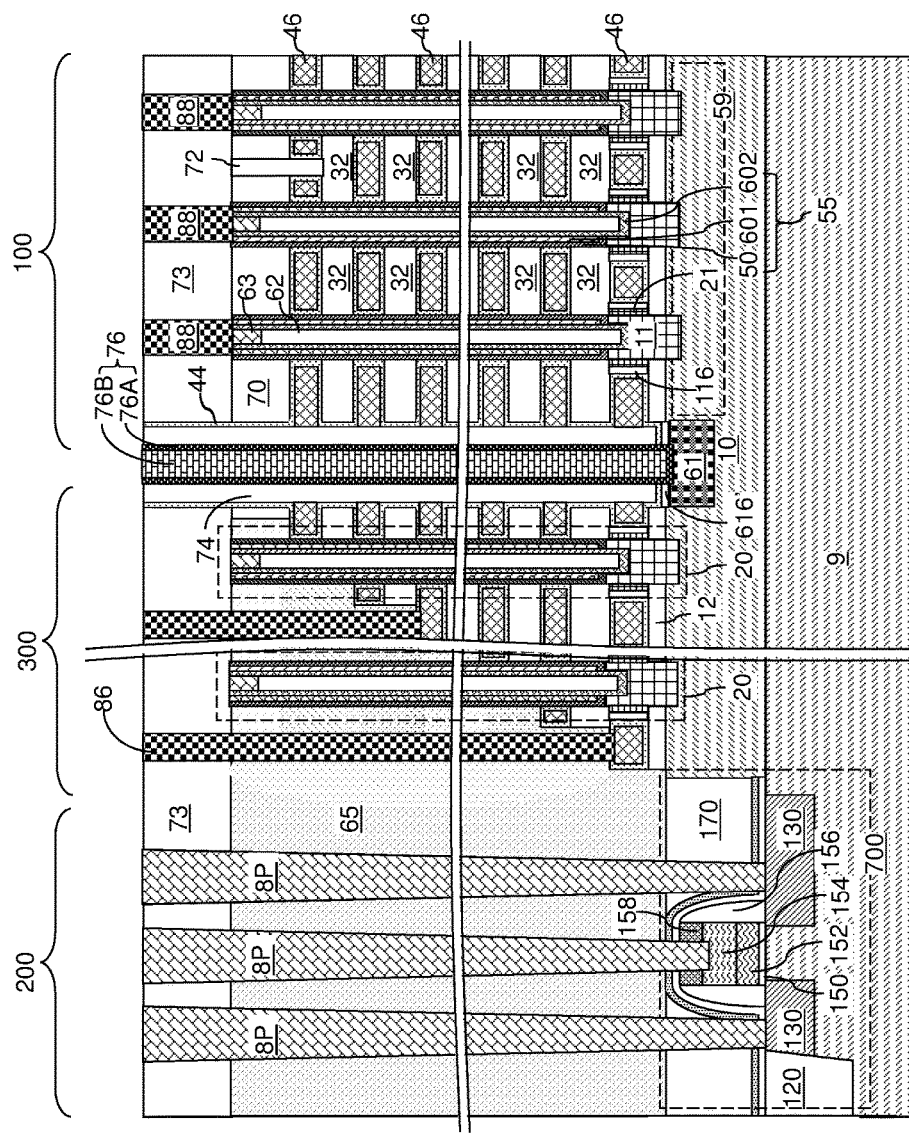
FIG. 13A is a schematic vertical cross-sectional view of the exemplary structure after formation of additional contact via structures according to an embodiment of the present disclosure.
Figure 13B:
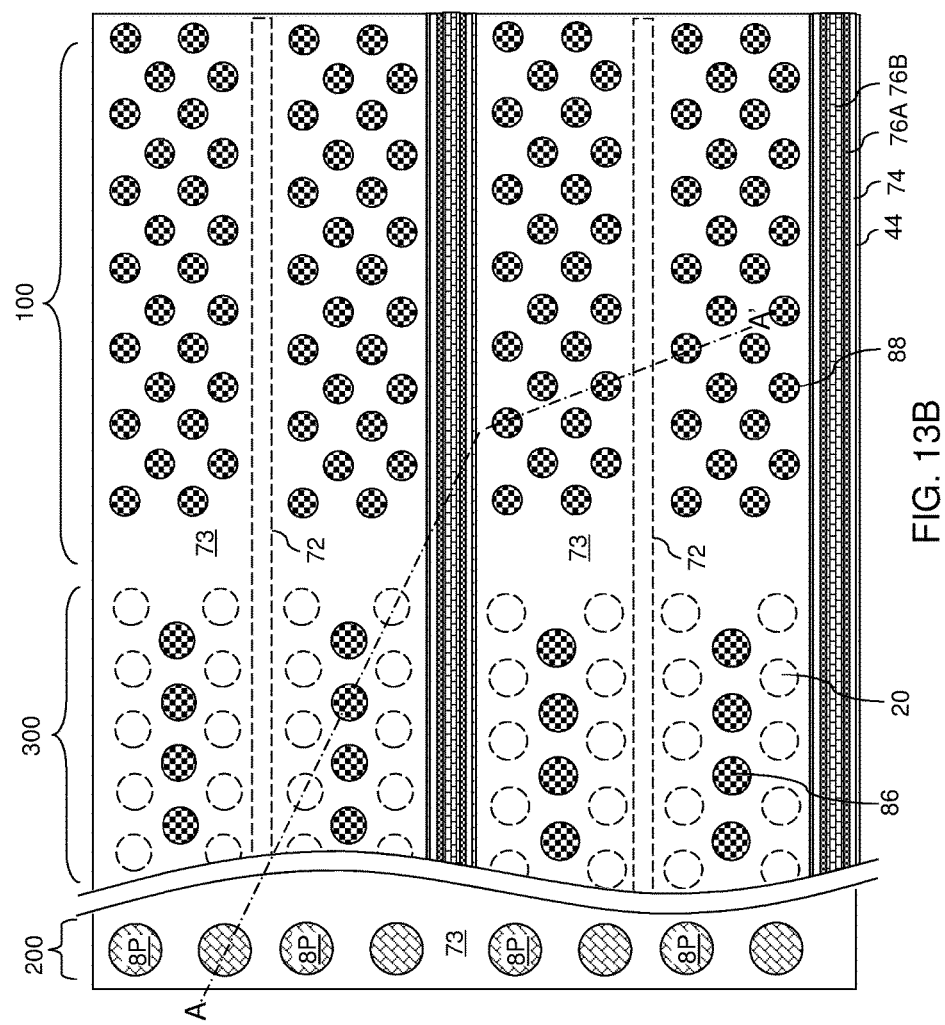
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

The various embodiments of the present disclosure provide a structure including a three-dimensional memory device. The three-dimensional memory device can include an alternating stack (32, 46) of insulating layers 32 and electrically conductive layers 46 located over a substrate (9, 10); a memory opening 49 extending through the alternating stack (32, 46), wherein sidewalls of the memory opening 49 comprise sidewalls of the insulating layers 32; a memory stack structure 55 located inside the memory opening 49 and comprising a memory film 50 that contacts the sidewalls of the memory opening 49, and a vertical semiconductor channel 60 contacting an inner sidewall of the memory film 50; and a semiconductor pedestal (11, 21) underlying the memory stack structure 55 and located at a lowest level among the electrically conductive layers 46, wherein the semiconductor pedestal (11, 21) includes a laterally protruding semiconductor portion 21 having an outer sidewall that is located farther outward from a vertical axis extending through a geometrical center of the memory stack structure 55 than an outermost sidewall of the memory stack structure 55 is from the vertical axis.

In one embodiment, the substrate (9, 10) comprises a single crystalline semiconductor material layer, and the semiconductor pedestal (11, 21) comprises an epitaxial semiconductor material portion in epitaxial alignment with the single crystalline semiconductor material layer 10. In one embodiment, the semiconductor pedestal (11, 21) comprises a columnar semiconductor pedestal portion 11 vertically extending through an entire thickness of the lowest level among the electrically conductive layers 46 and contacting the memory stack structure 55. In one embodiment, the laterally protruding semiconductor portion 21 surrounds the columnar semiconductor pedestal portion 11 and has an annular shape, and a vertical interface between the laterally protruding semiconductor portion 21 and the columnar semiconductor pedestal portion 11 can be vertically coincident with the outermost sidewall of the memory stack structure 55.

In one embodiment, a tubular semiconductor oxide spacer 116 can laterally surround the semiconductor pedestal (11, 21). One of the electrically conductive layers 46 located at the lowest level among the electrically conductive layers 46 can laterally surround the tubular semiconductor oxide spacer 116. In one embodiment, the tubular semiconductor oxide spacer 116 can comprises an oxide of a semiconductor material within a portion of the semiconductor pedestal (11, 21) that contacts the tubular semiconductor oxide spacer 116, which can be the laterally protruding semiconductor portion 21.

In one embodiment, the alternating stack (32, 46) can comprise a terrace region in which each electrically conductive layer 46 other than a topmost electrically conductive layer 46 within the alternating stack (32, 46) laterally extends farther than any overlying electrically conductive layer 46 within the alternating stack (32, 46), and the terrace region includes stepped surfaces of the alternating stack (32, 46) that continuously extend from a bottommost layer within the alternating stack (32, 46) to a topmost layer within the alternating stack (32, 46). Support pillar structures 20 can extend through the stepped surfaces and through a retro-stepped dielectric material portion 65 that overlies the stepped surfaces.

A backside blocking dielectric layer 44 can be disposed between each neighboring pair of an electrically conductive layer 46 and an insulating layer 32, and can extend from a bottommost layer within the alternating stack (32, 46) to a topmost layer within the alternating stack (32, 46). The semiconductor pedestal (11, 21) can be laterally spaced from the backside blocking dielectric layer by a tubular semiconductor oxide spacer 116.

The exemplary structure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Each semiconductor pedestal (11, and optionally 21) of the present disclosure includes more semiconductor material than a comparative semiconductor pedestal that does not employ a laterally protruding semiconductor portion 21 at least during the manufacturing process because the laterally protruding semiconductor portion 21 adds additional semiconductor material to the original semiconductor material provided in a columnar semiconductor pedestal portion 11. Thus, the total amount of the remaining semiconductor material after formation of a tubular semiconductor oxide spacer 116 is more for the semiconductor pedestal (11, and optionally 21) of the present disclosure than for the comparative semiconductor pedestal that does not employ the laterally protruding semiconductor portion 21 upon formation of a tubular semiconductor oxide portion of a same thickness thereupon. The additional semiconductor material provided within the semiconductor pedestal (11, and optionally 21) of the present disclosure provides increased mechanical stability under mechanical stress to the semiconductor pedestal, for example, during the oxidation process that forms the tubular semiconductor oxide spacers 116 and/or during formation of the electrically conductive layers 46. In other words, the semiconductor pedestal is thinned to a lesser degree during oxidation if portions 21 are added to the pedestal during manufacture and the resulting thicker semiconductor pedestal has improved mechanical properties due to increased thickness. Thus, the semiconductor pedestal (11, optionally 21) of the present disclosure can enhance yield and/or reliability of the semiconductor structure in which instances of the semiconductor pedestal (11, and optionally 21) of the present disclosure are embedded such as a three-dimensional NAND memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   a memory opening extending through the alternating stack, wherein sidewalls of the memory opening comprise sidewalls of the insulating layers;
   a memory stack structure located inside the memory opening and comprising a memory film that contacts the sidewalls of the memory opening, and a vertical semiconductor channel contacting an inner sidewall of the memory film; and
   a semiconductor pedestal underlying the memory stack structure and located at a lowest level among the electrically conductive layers, wherein the semiconductor pedestal includes a laterally protruding semiconductor portion having an outer sidewall that is located farther outward from a vertical axis extending through a geometrical center of the memory stack structure than an outermost sidewall of the memory stack structure is from the vertical axis,
   wherein:
   the semiconductor pedestal comprises a columnar semiconductor pedestal portion vertically extending through an entire thickness of the lowest level among the electrically conductive layers and contacting the memory stack structure;
   the laterally protruding semiconductor portion surrounds the columnar semiconductor pedestal portion and has an annular shape;
   a vertical interface between the laterally protruding semiconductor portion and the columnar semiconductor pedestal portion is vertically coincident with the outermost sidewall of the memory stack structure; and
   the three-dimensional memory device comprises at least one feature selected from:
      (a) a first feature that the laterally protruding semiconductor portion has a uniform lateral thickness throughout or curved outer sidewalls: or
      (b) a second feature that the laterally protruding semiconductor portion has a different material composition than the columnar semiconductor pedestal portion.

2. The three-dimensional memory device of claim 1, wherein:
the substrate comprises a single crystalline semiconductor material layer; and
the semiconductor pedestal comprises an epitaxial semiconductor material portion in epitaxial alignment with the single crystalline semiconductor material layer.

3. The three-dimensional memory device of claim 1, wherein the three-dimensional memory device comprises the first feature.

4. The three-dimensional memory device of claim 1, wherein the three-dimensional memory device comprises the second feature.

5. The three-dimensional memory device of claim 1, wherein an entirety of the vertical interface between the laterally protruding semiconductor portion and the columnar semiconductor pedestal is vertically coincident with the sidewalls of the memory opening.

6. The three-dimensional memory device of claim 1, further comprising a tubular semiconductor oxide spacer that laterally surrounds the semiconductor pedestal, wherein one of the electrically conductive layers located at the lowest level among the electrically conductive layers laterally surrounds the tubular semiconductor oxide spacer.

7. The three-dimensional memory device of claim 6, wherein the tubular semiconductor oxide spacer comprises an oxide of a semiconductor material within a portion of the semiconductor pedestal that contacts the tubular semiconductor oxide spacer.

8. The three-dimensional memory device of claim 1, wherein a bottom portion of the vertical semiconductor channel protrudes into an upper center portion of the semiconductor pedestal.

9. The three-dimensional memory device of claim 1, wherein:
a first annular horizontal surface of the semiconductor pedestal that is adjoined to the outer sidewall of the laterally protruding semiconductor portion is in physical contact with a horizontal bottom surface of one of the insulating layers; and
a second annular horizontal surface of the semiconductor pedestal that is adjoined to the outer sidewall of the laterally protruding semiconductor portion is in physical contact with a horizontal top surface of a dielectric material layer underlying a bottommost layer among the electrically conductive layers.

10. The three-dimensional memory device of claim 9, wherein:
a topmost surface of the semiconductor pedestal is located above a horizontal plane including the first annular horizontal surface of the semiconductor pedestal and within an area defined by a periphery of the sidewalls of the memory opening; and
a bottommost surface of the semiconductor pedestal is located below a horizontal plane including the second annular horizontal surface of the semiconductor pedestal and within the area defined by the periphery of the sidewalls of the memory opening.

11. The three-dimensional memory device of claim 1, wherein:
the alternating stack comprises a terrace region in which each electrically conductive layer other than a topmost electrically conductive layer within the alternating stack laterally extends farther than any overlying electrically conductive layer within the alternating stack;
the terrace region includes stepped surfaces of the alternating stack that continuously extend from a bottommost layer within the alternating stack to a topmost layer within the alternating stack; and
support pillar structures extend through the stepped surfaces and through a retro-stepped dielectric material portion that overlies the stepped surfaces.

12. The three-dimensional memory device of claim 1, further comprising a backside blocking dielectric layer disposed between each neighboring pair of an electrically conductive layer and an insulating layer and extending from a bottommost layer within the alternating stack to a topmost layer within the alternating stack, wherein the semiconductor pedestal is laterally spaced from the backside blocking dielectric layer by a tubular semiconductor oxide spacer.

13. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of vertical semiconductor channels having a same structure as the vertical semiconductor channel, wherein at least one end portion of each of the plurality of vertical semiconductor channels extends substantially perpendicular to a top surface of the substrate, and
a plurality of charge storage elements, each charge storage element located adjacent to a respective one of the plurality of semiconductor channels.

14. A three-dimensional memory device comprising:
an alternating stack of insulating layers and electrically conductive layers located over a substrate;
a memory opening extending through the alternating stack, wherein sidewalls of the memory opening comprise sidewalls of the insulating layers;
a memory stack structure located inside the memory opening and comprising a memory film that contacts the sidewalls of the memory opening, and a vertical semiconductor channel contacting an inner sidewall of the memory film; and
a semiconductor pedestal underlying the memory stack structure and located at a lowest level among the electrically conductive layers, wherein the semiconductor pedestal includes a laterally protruding semiconductor portion having an outer sidewall that is located farther outward from a vertical axis extending through a geometrical center of the memory stack structure than an outermost sidewall of the memory stack structure is from the vertical axis, wherein the three-dimensional memory device comprises at least one feature selected from:
(a) a first feature that the three-dimensional memory device further comprises a tubular semiconductor oxide spacer that laterally surrounds the semiconductor pedestal, wherein one of the electrically conductive layers located at the lowest level among the electrically conductive layers laterally surrounds the tubular semiconductor oxide spacer;
(b) a second feature that a first annular horizontal surface of the semiconductor pedestal that is adjoined to the outer sidewall of the laterally protruding semiconductor portion is in physical contact with a horizontal bottom surface of one of the insulating layers, and a second annular horizontal surface of the semiconductor pedestal that is adjoined to the outer sidewall of the laterally protruding semiconductor portion is in physical contact with a horizontal top surface of a dielectric material layer underlying a bottommost layer among the electrically conductive layers; or
(c) a third feature that the three-dimensional memory device further comprises a backside blocking dielectric layer disposed between each neighboring pair of an electrically conductive layer and an insulating layer and extending from a bottommost layer within the alternating stack to a topmost layer within the alternating stack, wherein the semiconductor pedestal is laterally spaced from the backside blocking dielectric layer by a tubular semiconductor oxide spacer.

15. The three-dimensional memory device of claim 14, wherein:
the substrate comprises a single crystalline semiconductor material layer; and
the semiconductor pedestal comprises an epitaxial semiconductor material portion in epitaxial alignment with the single crystalline semiconductor material layer.

16. The three-dimensional memory device of claim 14, wherein the semiconductor pedestal comprises a columnar semiconductor pedestal portion vertically extending through an entire thickness of the lowest level among the electrically conductive layers and contacting the memory stack structure,
wherein:
the laterally protruding semiconductor portion surrounds the columnar semiconductor pedestal portion and has an annular shape; and
a vertical interface between the laterally protruding semiconductor portion and the columnar semiconductor pedestal portion is vertically coincident with the outermost sidewall of the memory stack structure.

17. The three-dimensional memory device of claim 16, wherein the laterally protruding semiconductor portion has a uniform lateral thickness throughout or curved outer sidewalls.

18. The three-dimensional memory device of claim 16, wherein the laterally protruding semiconductor portion has a different material composition than the columnar semiconductor pedestal portion.

19. The three-dimensional memory device of claim 14, wherein an entirety of the vertical interface between the laterally protruding semiconductor portion and the columnar semiconductor pedestal is vertically coincident with the sidewalls of the memory opening.

20. The three-dimensional memory device of claim 14, wherein the three-dimensional memory device comprises the first feature, and wherein the tubular semiconductor oxide spacer comprises an oxide of a semiconductor material within a portion of the semiconductor pedestal that contacts the tubular semiconductor oxide spacer.

21. The three-dimensional memory device of claim 14, wherein a bottom portion of the vertical semiconductor channel protrudes into an upper center portion of the semiconductor pedestal.

22. The three-dimensional memory device of claim 14, wherein the three-dimensional memory device comprises the second feature.

23. The three-dimensional memory device of claim 22, wherein:
a topmost surface of the semiconductor pedestal is located above a horizontal plane including the first annular horizontal surface of the semiconductor pedestal and within an area defined by a periphery of the sidewalls of the memory opening; and
a bottommost surface of the semiconductor pedestal is located below a horizontal plane including the second annular horizontal surface of the semiconductor pedestal and within the area defined by the periphery of the sidewalls of the memory opening.

24. The three-dimensional memory device of claim 14, wherein:
the alternating stack comprises a terrace region in which each electrically conductive layer other than a topmost electrically conductive layer within the alternating stack laterally extends farther than any overlying electrically conductive layer within the alternating stack;
the terrace region includes stepped surfaces of the alternating stack that continuously extend from a bottommost layer within the alternating stack to a topmost layer within the alternating stack; and
support pillar structures extend through the stepped surfaces and through a retro-stepped dielectric material portion that overlies the stepped surfaces.

25. The three-dimensional memory device of claim 14, wherein the three-dimensional memory device comprises the third feature.

26. The three-dimensional memory device of claim 14, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of vertical semiconductor channels having a same structure as the vertical semiconductor channel, wherein at least one end portion of each of the plurality of vertical semiconductor channels extends substantially perpendicular to a top surface of the substrate, and a plurality of charge storage elements, each charge storage element located adjacent to a respective one of the plurality of semiconductor channels.

* * * * *